US012475852B2

(12) United States Patent
Lee et al.

(10) Patent No.: US 12,475,852 B2
(45) Date of Patent: Nov. 18, 2025

(54) PIXEL CIRCUIT, DISPLAY PANEL AND DISPLAY DEVICE INCLUDING THE SAME

(71) Applicant: LG DISPLAY CO., LTD., Seoul (KR)

(72) Inventors: Dong Kyu Lee, Paju-si (KR); Geun Sik Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/535,975

(22) Filed: Dec. 11, 2023

(65) Prior Publication Data

US 2024/0221670 A1 Jul. 4, 2024

(30) Foreign Application Priority Data

Dec. 29, 2022 (KR) ........................ 10-2022-0188950

(51) Int. Cl.
*G09G 3/3241* (2016.01)
*H10K 59/80* (2023.01)

(52) U.S. Cl.
CPC ......... *G09G 3/3241* (2013.01); *H10K 59/879* (2023.02); *G09G 2300/0814* (2013.01);
(Continued)

(58) Field of Classification Search
CPC .. G09G 3/3241; G09G 3/3266; G09G 3/3233; G09G 3/3225; G09G 2300/0814;
(Continued)

(56) References Cited

U.S. PATENT DOCUMENTS 10,802,268 B2 10/2020 Lee et al.
11,108,023 B2 8/2021 Sim et al.
(Continued)

FOREIGN PATENT DOCUMENTS

CN 102467878 A 5/2012
CN 110600518 A 12/2019
(Continued)

OTHER PUBLICATIONS

Office Action in Japanese Appln. No. 2023-177058, mailed on Apr. 24, 2025, 8pages.
(Continued)

*Primary Examiner* — Ryan A Lubit
(74) *Attorney, Agent, or Firm* — Morgan, Lewis & Bockius LLP

(57) ABSTRACT

A pixel circuit, a display panel and a display device including the same according to an exemplary embodiment are disclosed. The pixel circuit according to the exemplary embodiment includes a first light-emitting element, a second light-emitting element, a driving element configured to generate a driving current of each of the first and second light-emitting elements, a first switch element connected between a gate electrode of the driving element and a power line through which a reference voltage is applied and turned on in response to a first gate signal, a second switch element connected between the driving element and the first light-emitting element and turned on in response to a second gate signal, and a third switch element connected between the driving element and the second light-emitting element and turned on in response to a third gate signal, wherein the first light-emitting element emits light at a first viewing angle, and the second light-emitting element emits light at a second viewing angle smaller than the first viewing angle.

14 Claims, 23 Drawing Sheets

(52) U.S. Cl.
CPC ............... *G09G 2300/0842* (2013.01); *G09G 2310/0286* (2013.01); *G09G 2310/08* (2013.01); *G09G 2320/068* (2013.01); *G09G 2358/00* (2013.01); *G09G 2380/10* (2013.01)

(58) Field of Classification Search
CPC ... G09G 2300/0842; G09G 2300/0809; G09G 2300/0426; G09G 2310/0286; G09G 2310/08; G09G 2320/068; G09G 2320/028; G09G 2358/00; G09G 2380/10; H10K 50/858; H10K 59/879
See application file for complete search history.

(56) References Cited

U.S. PATENT DOCUMENTS

| | | | | |
|---|---|---|---|---|
| 11,950,451 | B2* | 4/2024 | Song | H10K 59/8792 |
| 2006/0114193 | A1 | 6/2006 | Kwak | |
| 2006/0244697 | A1 | 11/2006 | Lee et al. | |
| 2009/0015732 | A1* | 1/2009 | Yabuta | G09G 3/3611 349/1 |
| 2009/0115705 | A1 | 5/2009 | Miller et al. | |
| 2009/0279005 | A1* | 11/2009 | Fukushima | G02F 1/133753 349/123 |
| 2011/0284881 | A1 | 11/2011 | Shikina | |
| 2012/0127064 | A1 | 5/2012 | Kawano | |
| 2015/0022508 | A1 | 1/2015 | Kim | |
| 2015/0048333 | A1 | 2/2015 | Choi | |
| 2015/0144925 | A1 | 5/2015 | Baek et al. | |
| 2015/0145907 | A1 | 5/2015 | Ryu | |
| 2015/0332628 | A1 | 11/2015 | Ren | |
| 2017/0200412 | A1* | 7/2017 | Gu | G09G 3/3266 |
| 2017/0330531 | A1 | 11/2017 | Yamazaki | |
| 2017/0365217 | A1 | 12/2017 | An | |
| 2018/0122292 | A1* | 5/2018 | Ju | G09G 3/2092 |
| 2018/0143354 | A1 | 5/2018 | Li | |
| 2018/0166510 | A1 | 6/2018 | Lee | |
| 2019/0025571 | A1 | 1/2019 | Lee | |
| 2019/0097167 | A1 | 3/2019 | Sun et al. | |
| 2019/0103060 | A1* | 4/2019 | Kang | H10D 86/60 |
| 2019/0180664 | A1 | 6/2019 | Sun et al. | |
| 2019/0197928 | A1* | 6/2019 | Schubert | G09G 3/32 |
| 2019/0206955 | A1 | 7/2019 | Paek | |
| 2020/0083484 | A1 | 3/2020 | Lee | |
| 2020/0211473 | A1 | 7/2020 | Kim et al. | |
| 2020/0258451 | A1 | 8/2020 | Takahara et al. | |
| 2020/0286448 | A1 | 9/2020 | Kim | |
| 2020/0365831 | A1 | 11/2020 | Polyakov | |
| 2021/0043709 | A1 | 2/2021 | Kim | |
| 2021/0191556 | A1 | 6/2021 | Lee | |
| 2021/0193763 | A1 | 6/2021 | Sun | |
| 2021/0201740 | A1 | 7/2021 | Kim | |
| 2021/0201798 | A1 | 7/2021 | Kim | |
| 2021/0202917 | A1* | 7/2021 | Lee | G06F 3/0443 |
| 2021/0223583 | A1 | 7/2021 | Heber et al. | |
| 2021/0265537 | A1 | 8/2021 | Shin | |
| 2021/0273203 | A1 | 9/2021 | Sano | |
| 2021/0327362 | A1 | 10/2021 | Park | |
| 2022/0036829 | A1 | 2/2022 | Jeong | |
| 2022/0139300 | A1 | 5/2022 | Yokoyama | |
| 2022/0148505 | A1* | 5/2022 | Chang | G09G 3/3233 |
| 2022/0158135 | A1 | 5/2022 | Irobe | |
| 2022/0163699 | A1* | 5/2022 | Zhang | G02B 3/0043 |
| 2022/0199013 | A1 | 6/2022 | Matsueda | |
| 2022/0301478 | A1 | 9/2022 | Jeong | |
| 2022/0319417 | A1 | 10/2022 | Liu | |
| 2022/0343843 | A1 | 10/2022 | Du et al. | |
| 2022/0358875 | A1 | 11/2022 | Won et al. | |
| 2022/0399529 | A1 | 12/2022 | Shin et al. | |
| 2023/0215357 | A1 | 7/2023 | Hong et al. | |
| 2023/0217690 | A1 | 7/2023 | Hong et el. | |
| 2023/0217691 | A1 | 7/2023 | Song | |
| 2024/0257719 | A1 | 8/2024 | Shin et al. | |
| 2024/0257769 | A1 | 8/2024 | Kim et al. | |
| 2024/0260423 | A1 | 8/2024 | Kang et al. | |
| 2024/0260424 | A1 | 8/2024 | Mun et al. | |
| 2024/0363068 | A1 | 10/2024 | Ko et al. | |
| 2025/0029556 | A1* | 1/2025 | Cho | G09G 3/3225 |
| 2025/0029565 | A1* | 1/2025 | Cho | G09G 3/3266 |

FOREIGN PATENT DOCUMENTS

| | | | |
|---|---|---|---|
| CN | 111063706 | A | 4/2020 |
| CN | 111223904 | | 6/2020 |
| CN | 214587961 | U | 11/2021 |
| CN | 114639794 | A | 6/2022 |
| CN | 111883684 | B | 8/2022 |
| EP | 4102573 | A1 | 12/2022 |
| EP | 4354421 | A1 | 4/2024 |
| JP | 2003-150109 | A | 5/2003 |
| JP | 2005-92075 | A | 4/2005 |
| JP | 2008-52058 | A | 3/2008 |
| JP | 2009-31656 | A | 2/2009 |
| JP | 2011-65773 | A | 3/2011 |
| JP | 2011-514538 | A | 5/2011 |
| JP | 2012-109137 | A | 6/2012 |
| JP | 2013-089074 | A | 5/2013 |
| JP | 2013-160999 | A | 8/2013 |
| JP | 2013-257533 | A | 12/2013 |
| JP | 2021-26187 | A | 2/2021 |
| JP | 2021-138342 | A | 9/2021 |
| JP | 2021-530746 | A | 11/2021 |
| JP | 2022-80507 | A | 5/2022 |
| KR | 10-2008-0023708 | A | 3/2008 |
| KR | 10-2011-0024450 | A | 3/2011 |
| KR | 10-2015-0061558 | A | 6/2015 |
| KR | 10-2016-0023268 | A | 3/2016 |
| KR | 10-1661206 | | 9/2016 |
| KR | 10-2018-0135342 | A | 12/2018 |
| KR | 10-2019-0011372 | A | 2/2019 |
| KR | 10-2019-0017501 | A | 2/2019 |
| KR | 10-2019-0038148 | A | 4/2019 |
| KR | 10-2020-0002103 | | 1/2020 |
| KR | 10-2020-0075597 | A | 6/2020 |
| KR | 10-2021-0130308 | A | 11/2021 |
| KR | 10-2021-0144400 | A | 11/2021 |
| KR | 10-2022-0165958 | A | 12/2022 |
| KR | 10-2023-0018836 | A | 2/2023 |
| KR | 10-2024-0120773 | A | 8/2024 |
| TW | 1776720 | B | 9/2022 |
| WO | WO 2011/145174 | A1 | 11/2011 |

OTHER PUBLICATIONS

Office Action in Taiwanese Appln. No. 112138610, mailed on Oct. 17, 2024, 12pages.

Japanese Office Action dated Sep. 24, 2024 issued in Patent Application No. 2023-177058, 4pages.

European Extended Search Report dated Jan. 30, 2024, issued in Patent Application No. 23202985.0, 14 pages.

Japanese Office Action dated Jan. 21, 2025 issued in Patent Application No. 2024-013354, 4pages.

European Extended Search Report dated May 22, 2023, issued in Patent Application No. 22208643.1, 8 pages.

Extended European Search Report dated Jun. 8, 2022 issued in corresponding EP Patent 21215293.8-1211, 10 pages.

* cited by examiner

【FIG. 1】
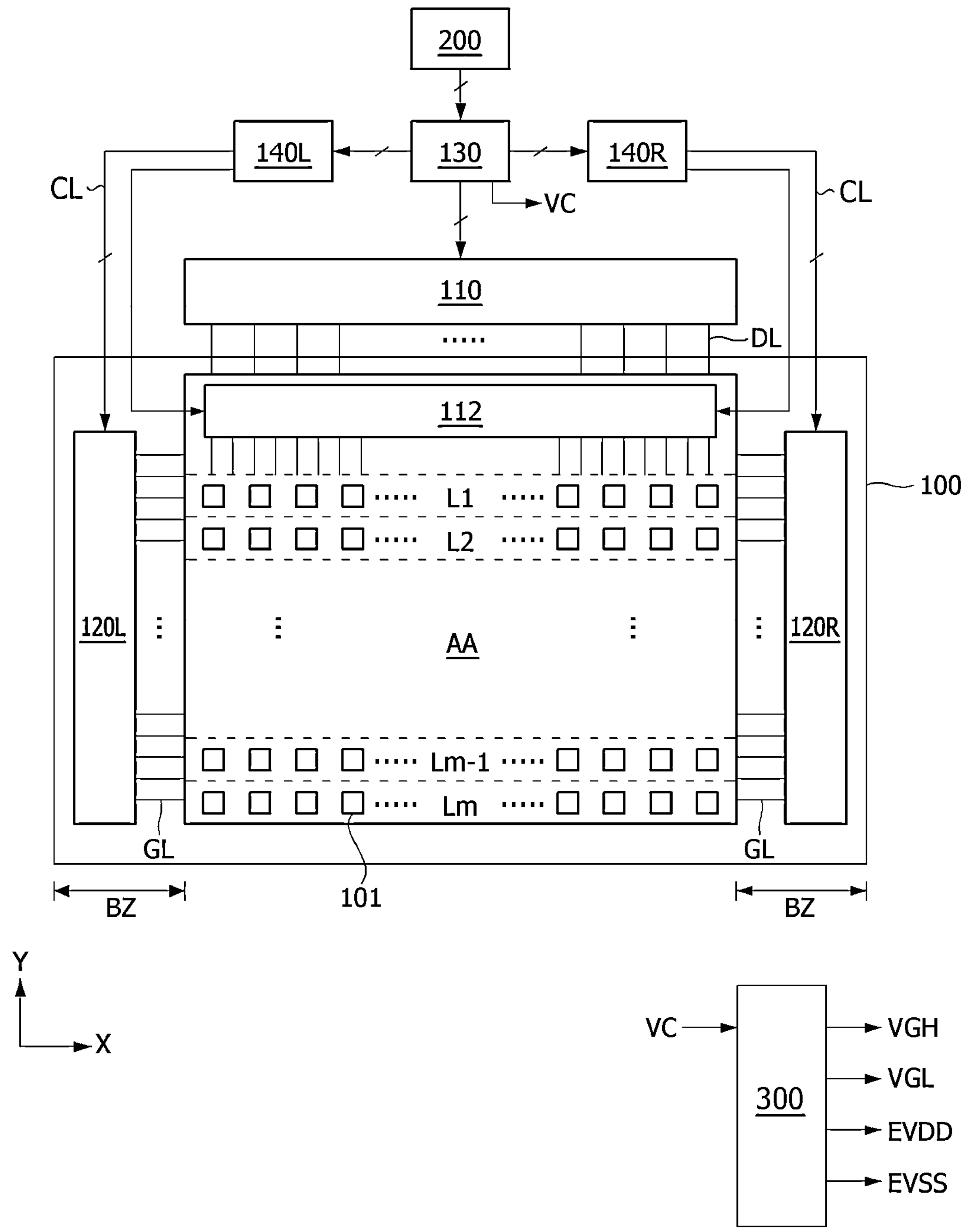

【FIG. 2】
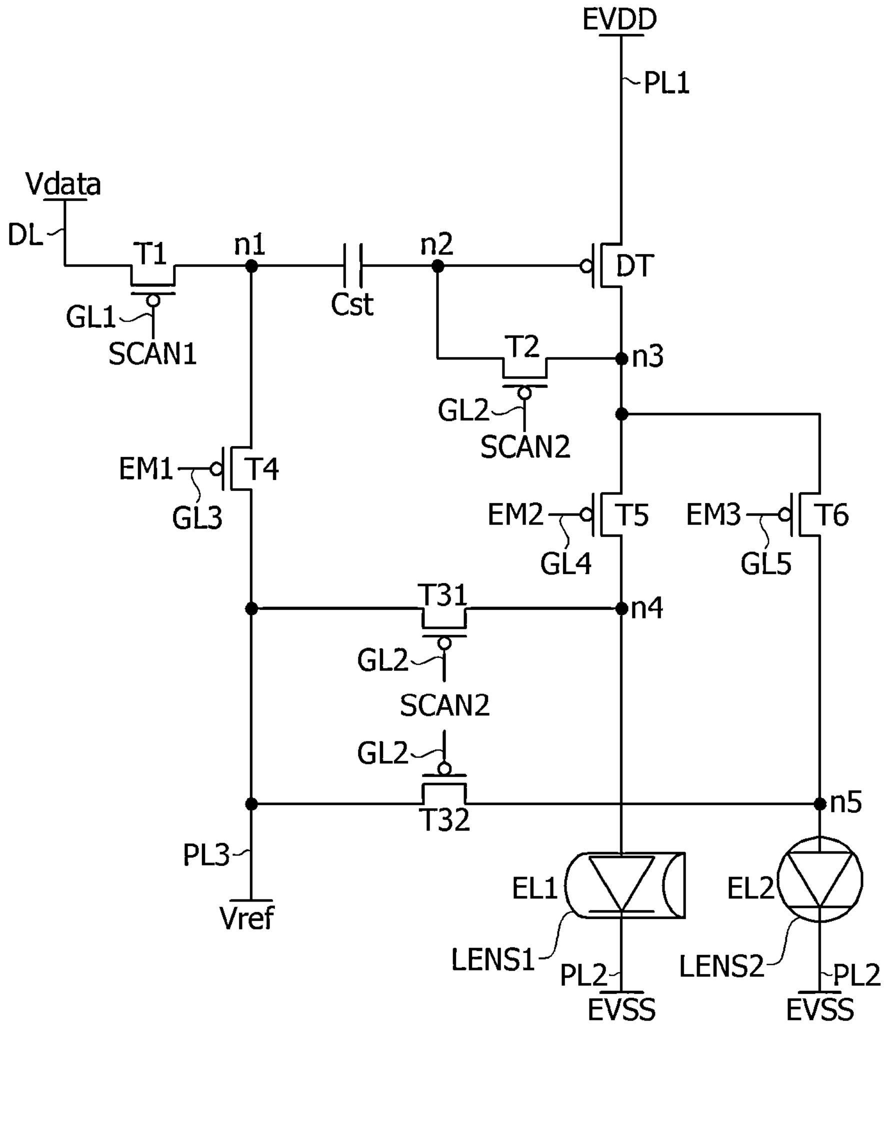

【FIG. 3】
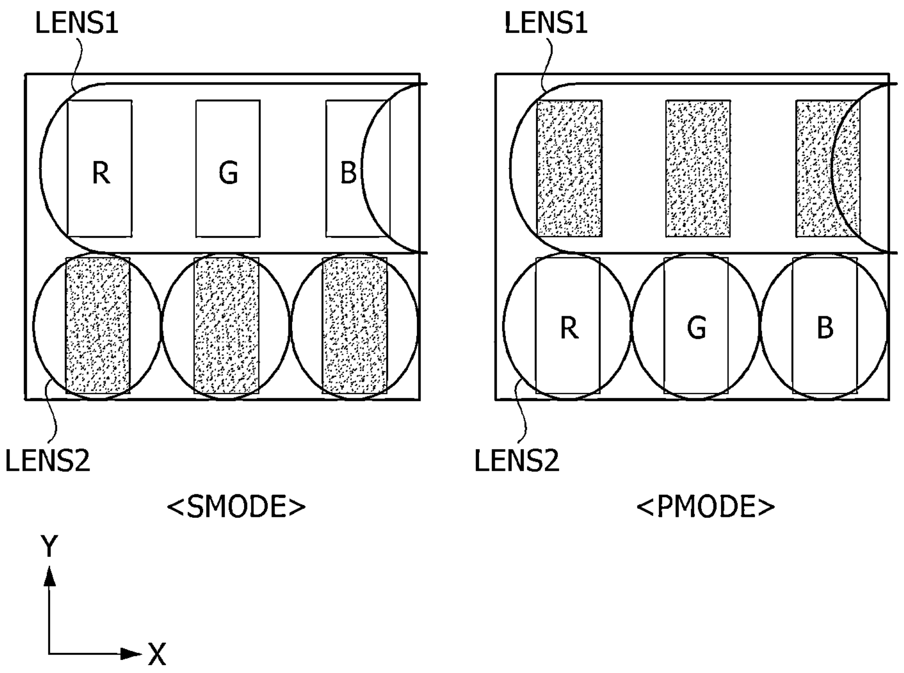

【FIG. 4A】
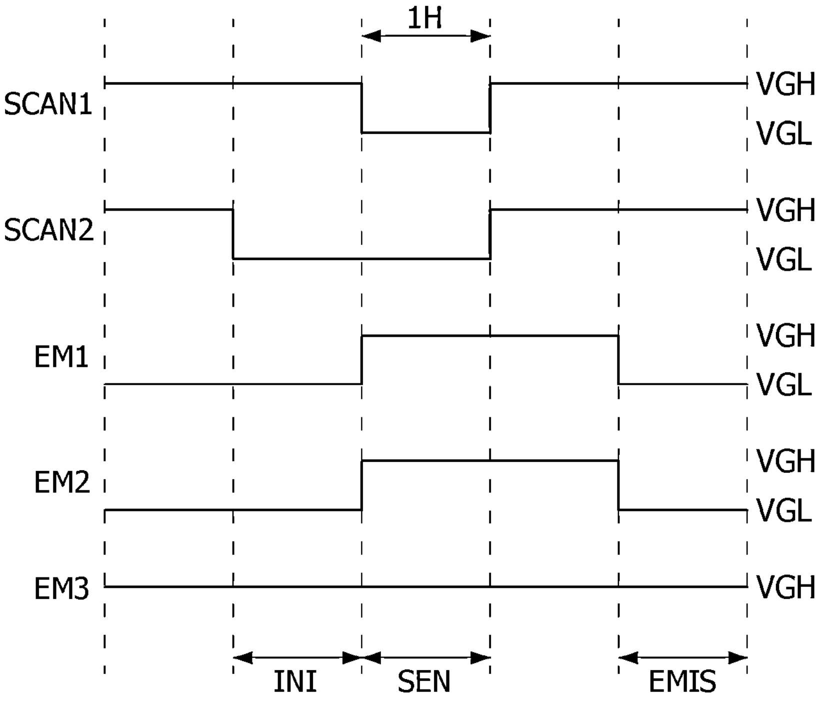
<SMODE>

【FIG. 4B】
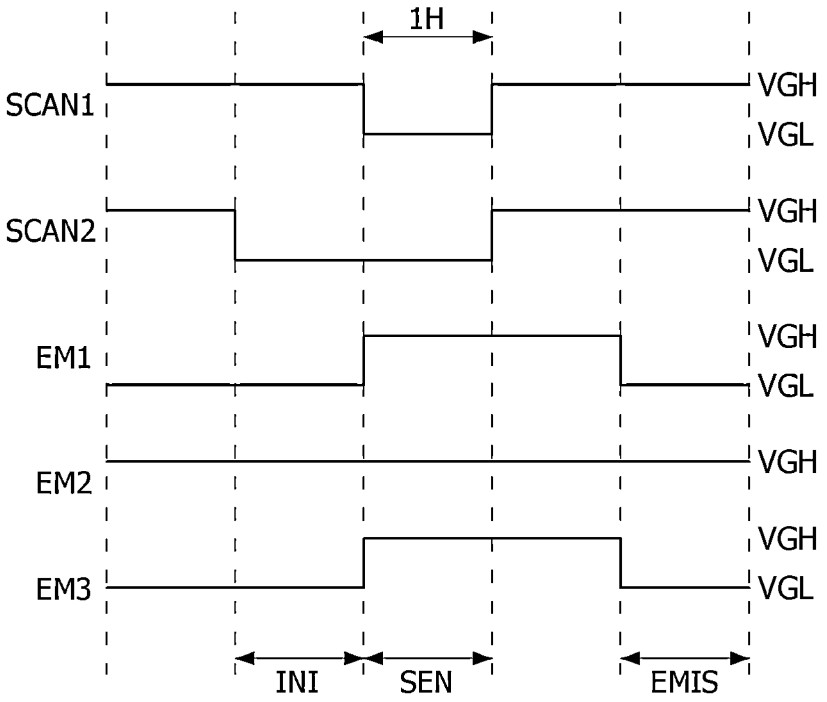
<PMODE>

【FIG. 5】
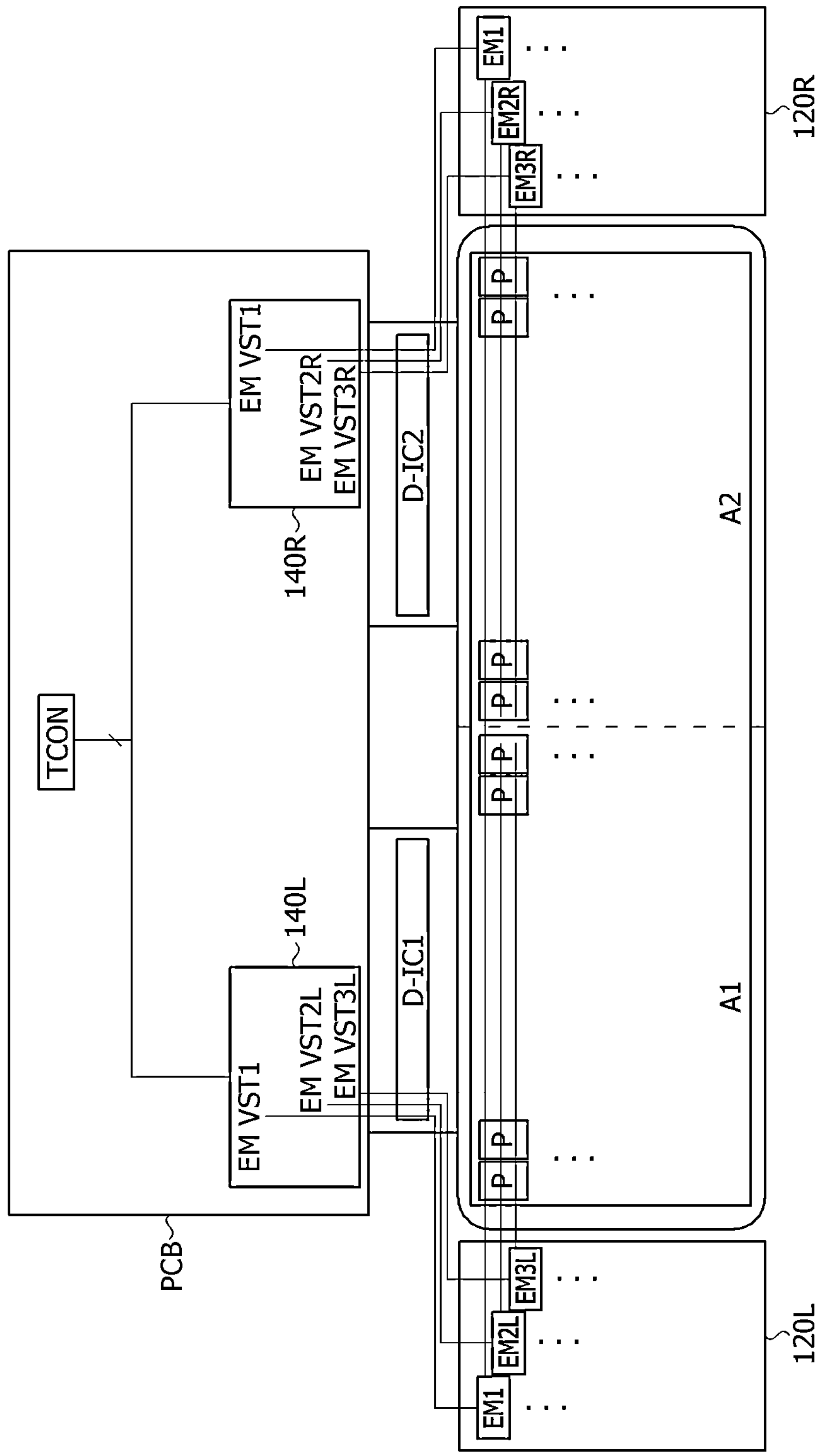

[FIG. 6A]
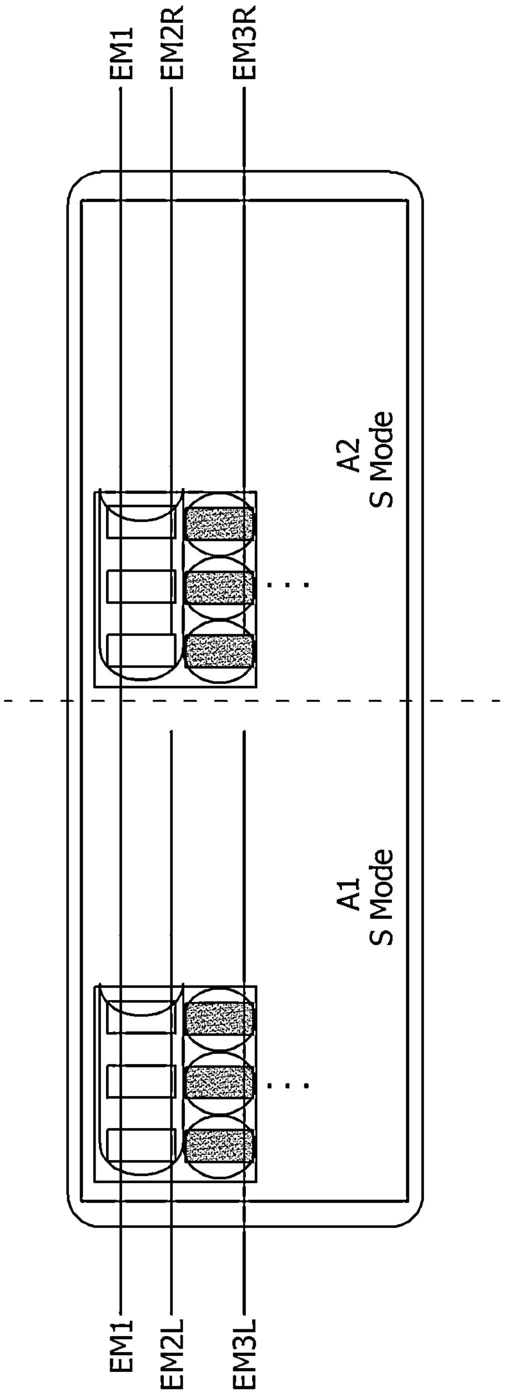
| EM1 | EM2L | EM3L | EM2R | EM3R |
|---|---|---|---|---|
| Low | Low | High | Low | High |

【FIG. 6B】
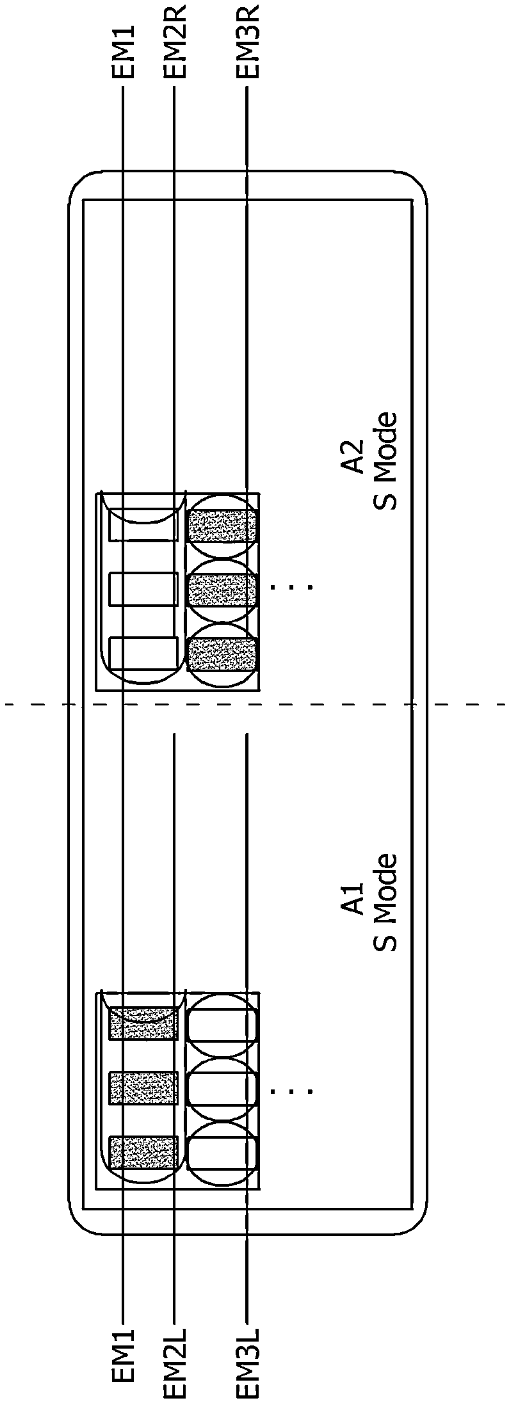
| EM1 | EM2L | EM3L | EM2R | EM3R |
|---|---|---|---|---|
| Low | High | Low | Low | High |

【FIG. 6C】
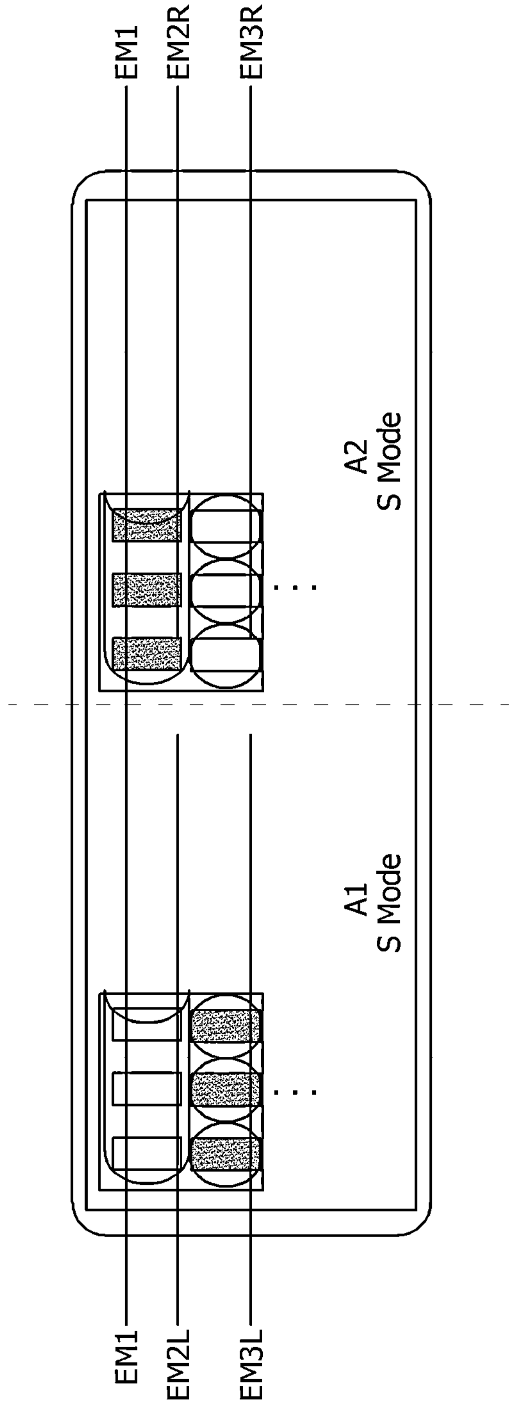
| EM1 | EM2L | EM3L | EM2R | EM3R |
|---|---|---|---|---|
| Low | Low | High | High | Low |

【FIG. 6D】
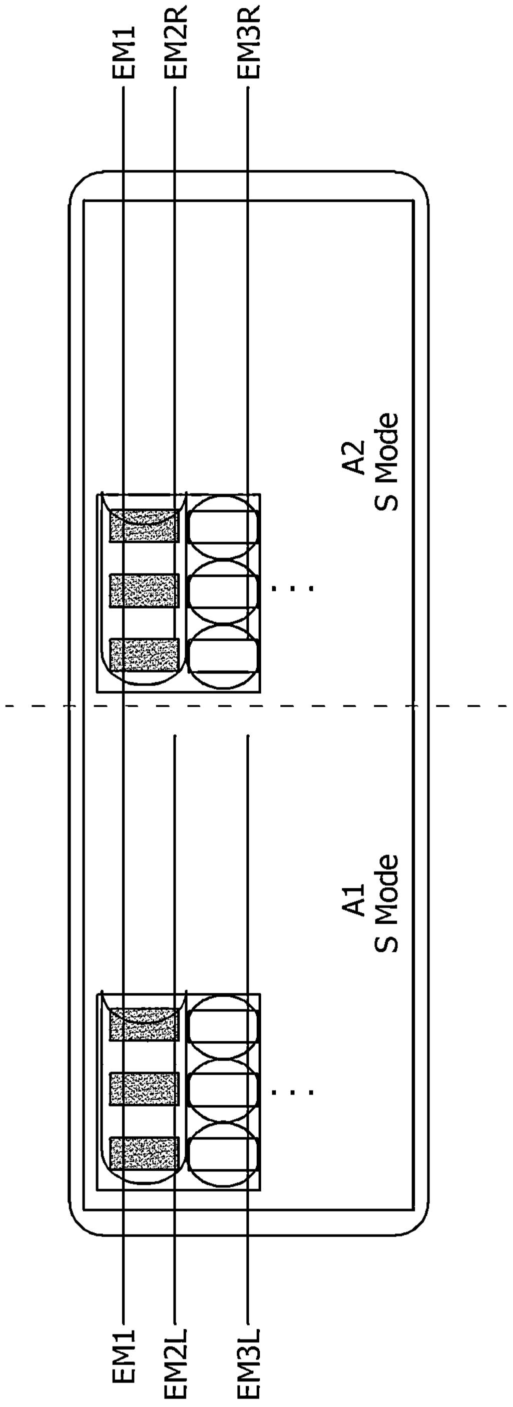
| EM1 | EM2L | EM3L | EM2R | EM3R |
|---|---|---|---|---|
| Low | High | Low | High | Low |

【FIG. 7】
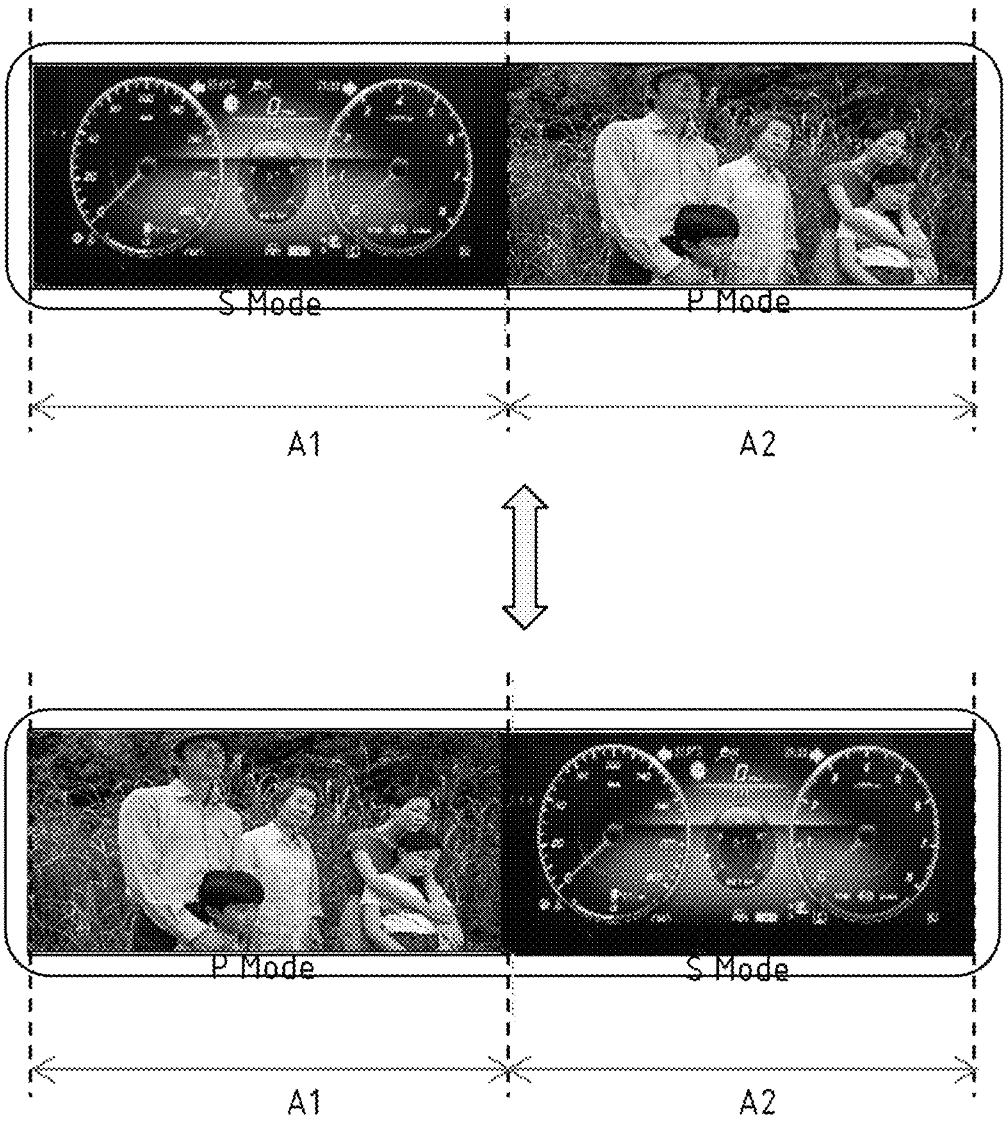

【FIG. 8】
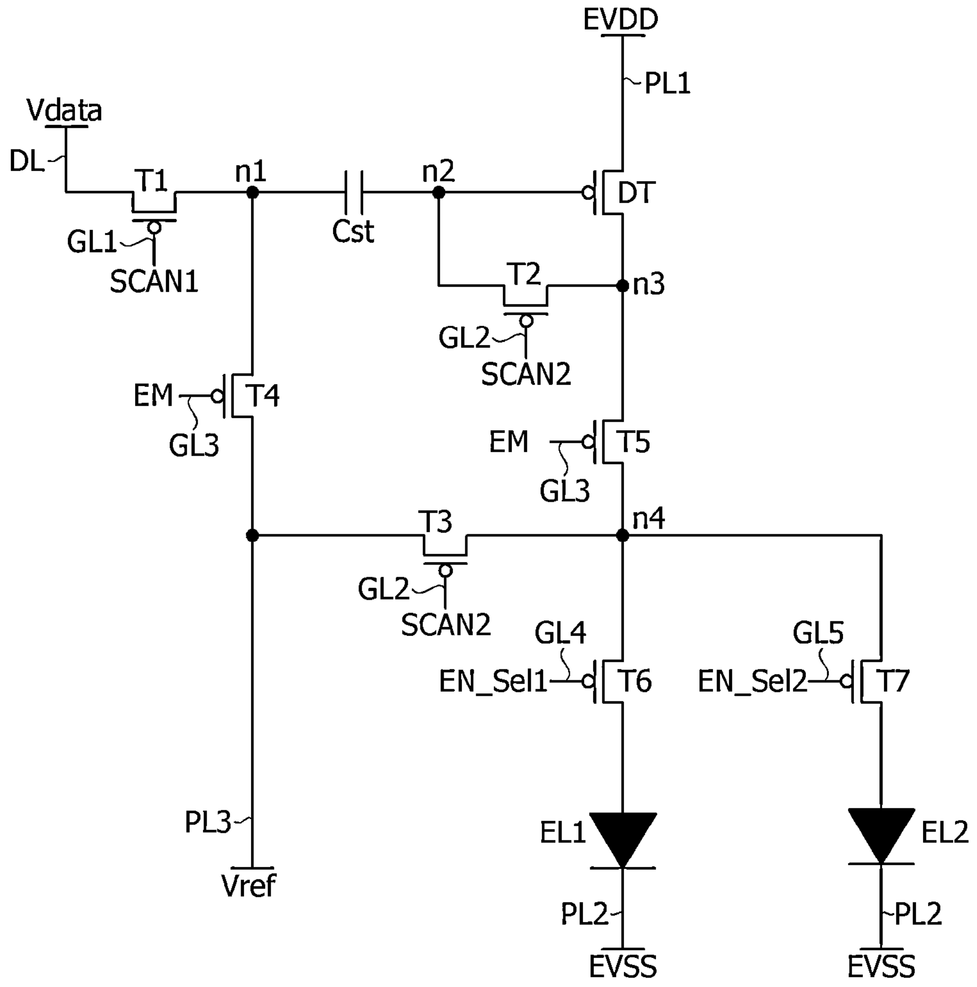

【FIG. 9】
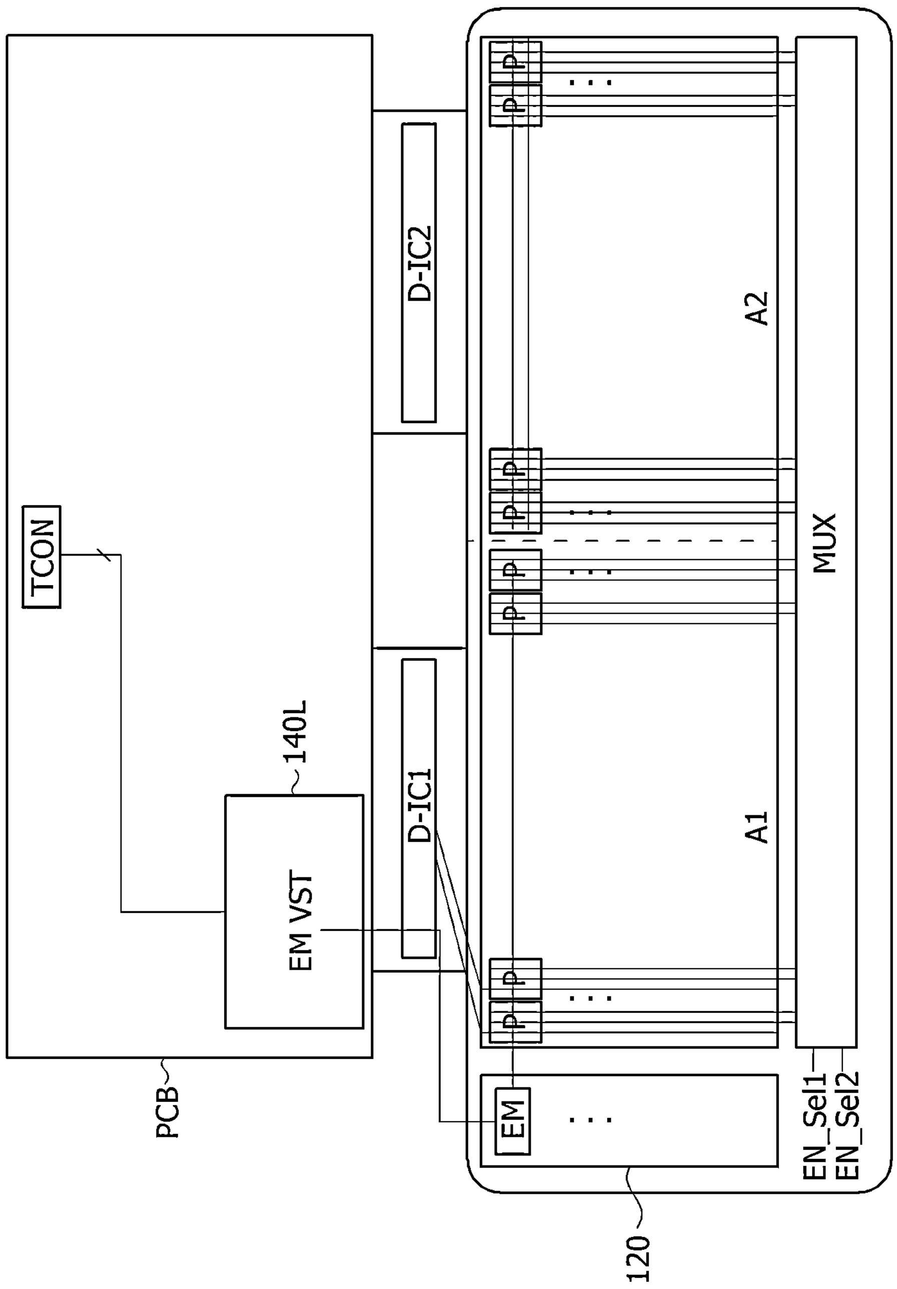

【FIG. 10】
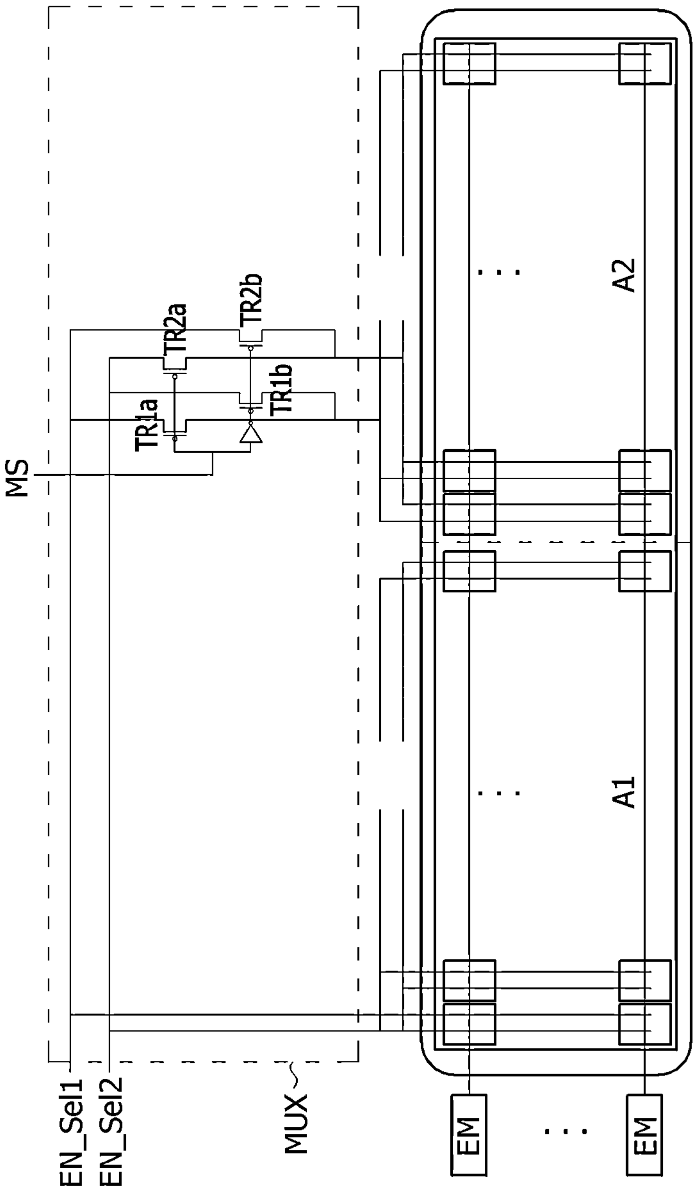

【FIG. 11A】
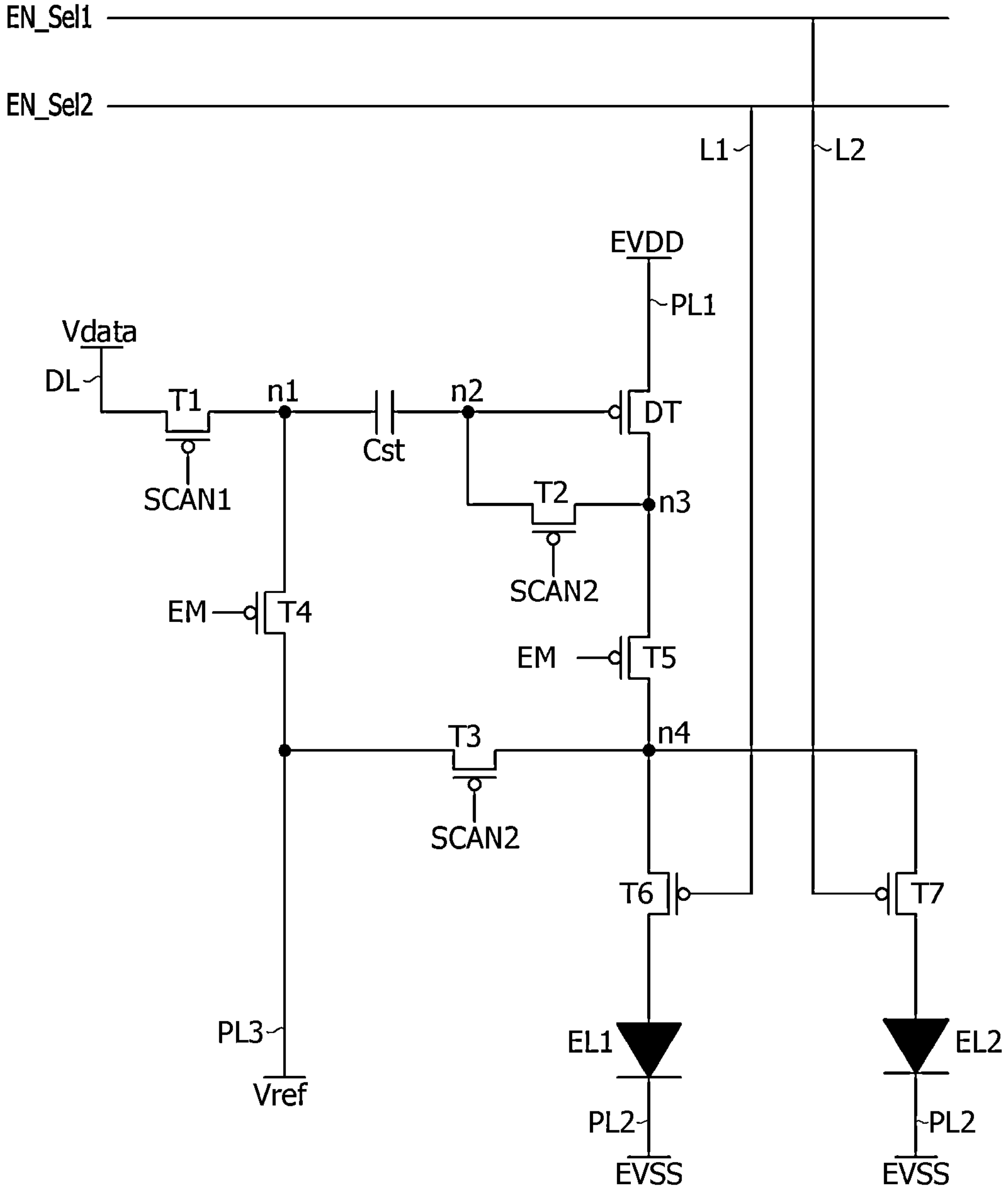

【FIG. 11B】
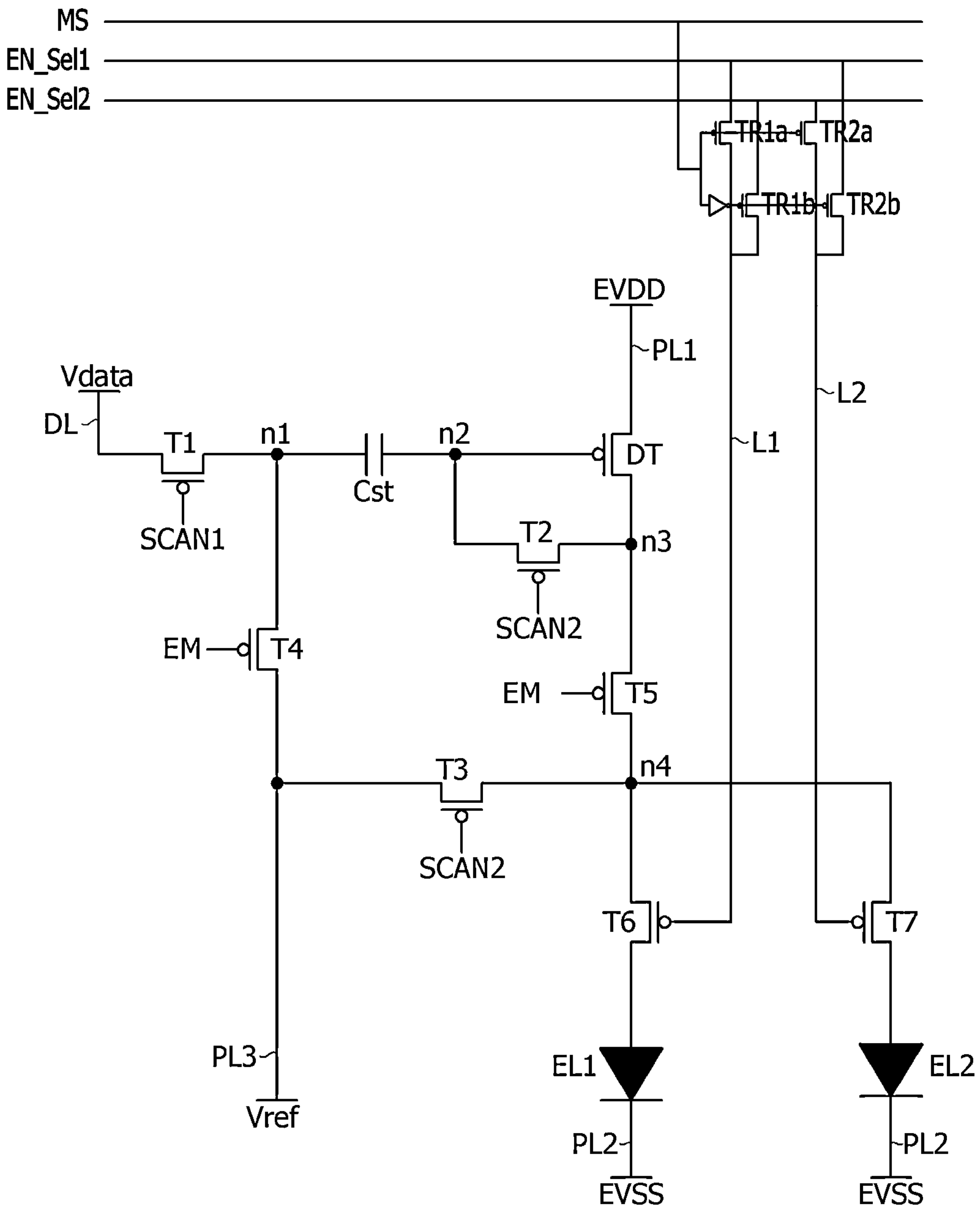

【FIG. 12】
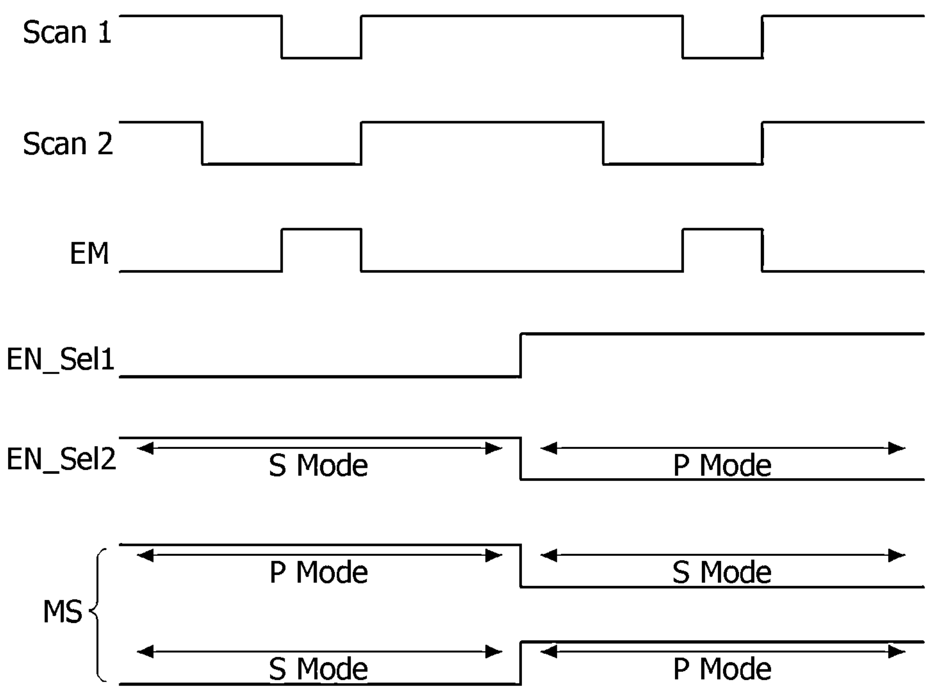

【FIG. 13A】
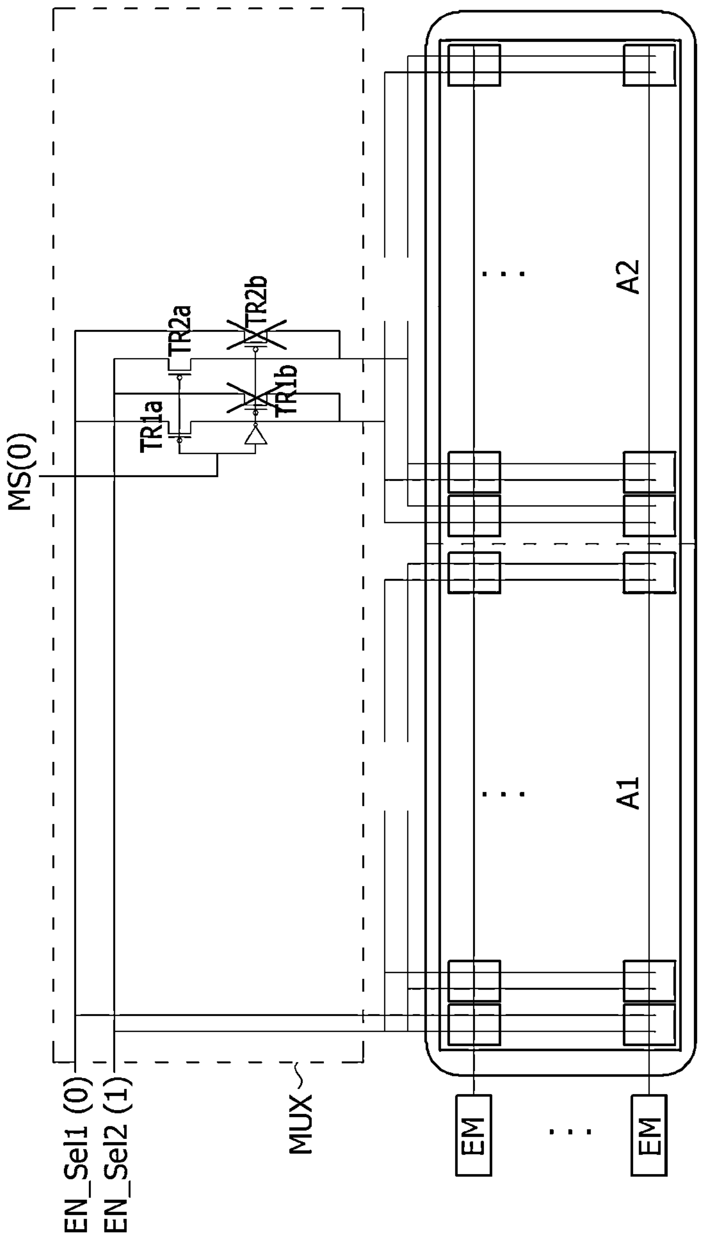
| En_Sel1 | En_Sel2 | MS |
|---|---|---|
| Low | High | Low |

【FIG. 13B】
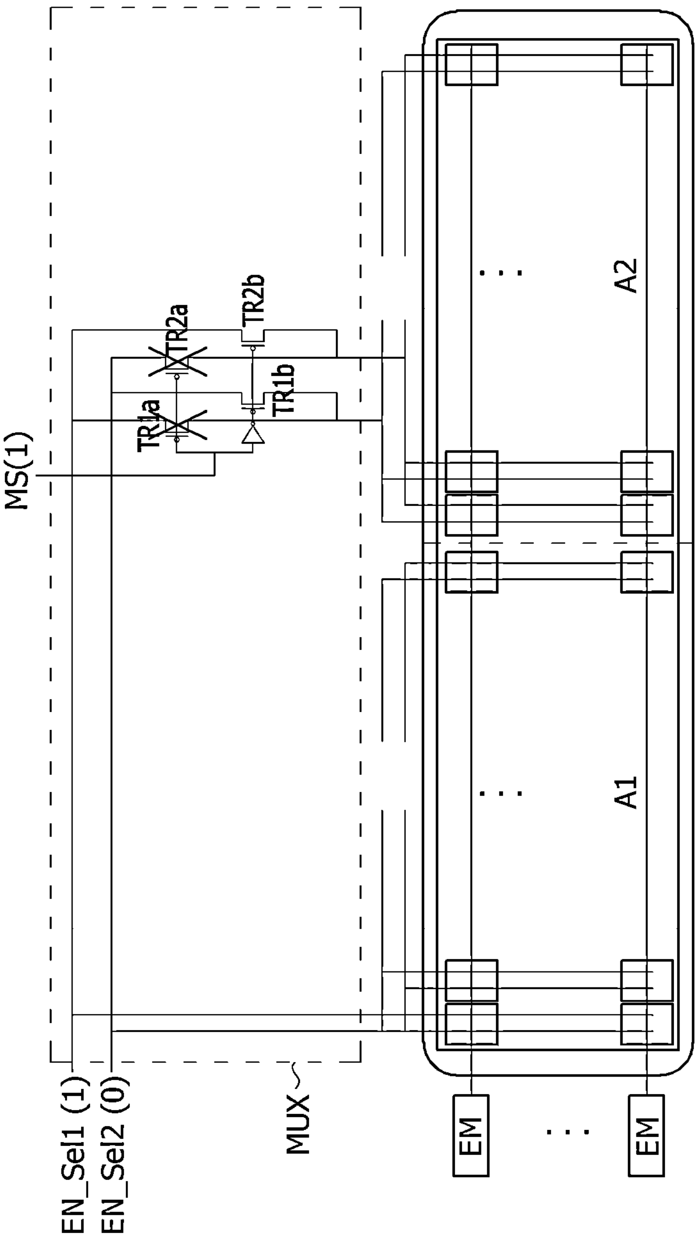
| En_Sel1 | En_Sel2 | MS |
|---|---|---|
| High | Low | High |

【FIG. 13C】
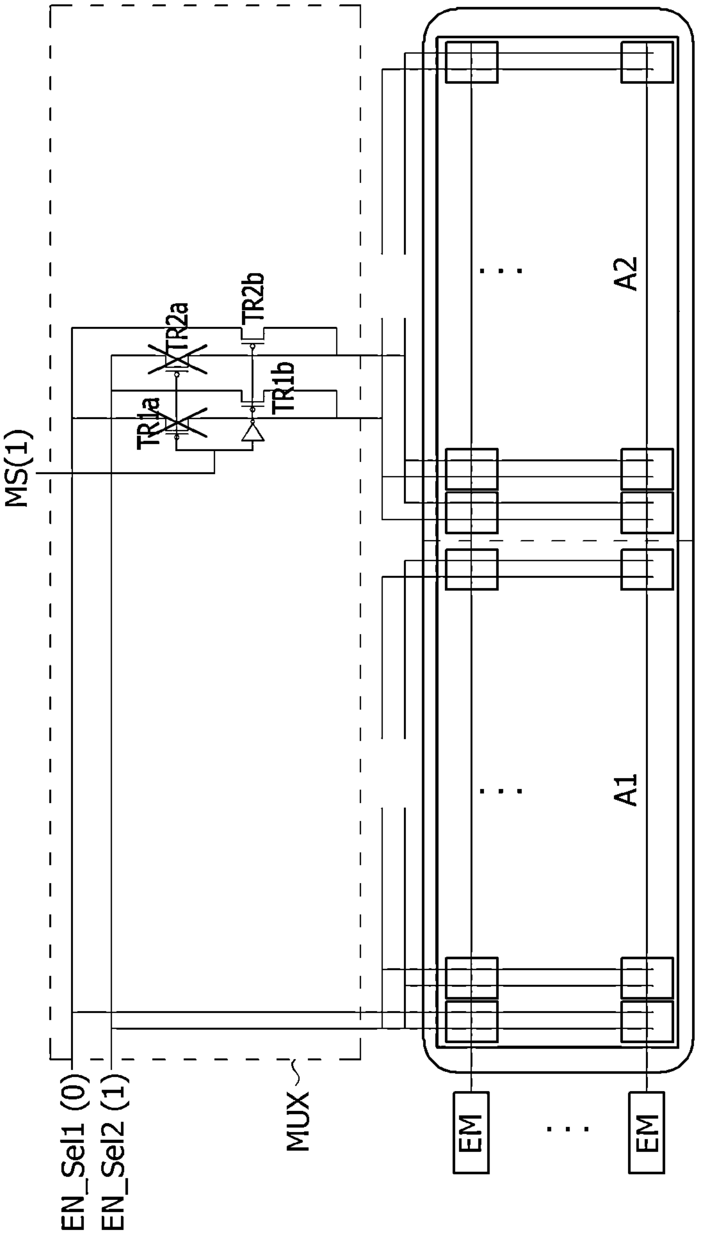
| En_Sel1 | En_Sel2 | MS |
|---|---|---|
| Low | High | High |

【FIG. 13D】
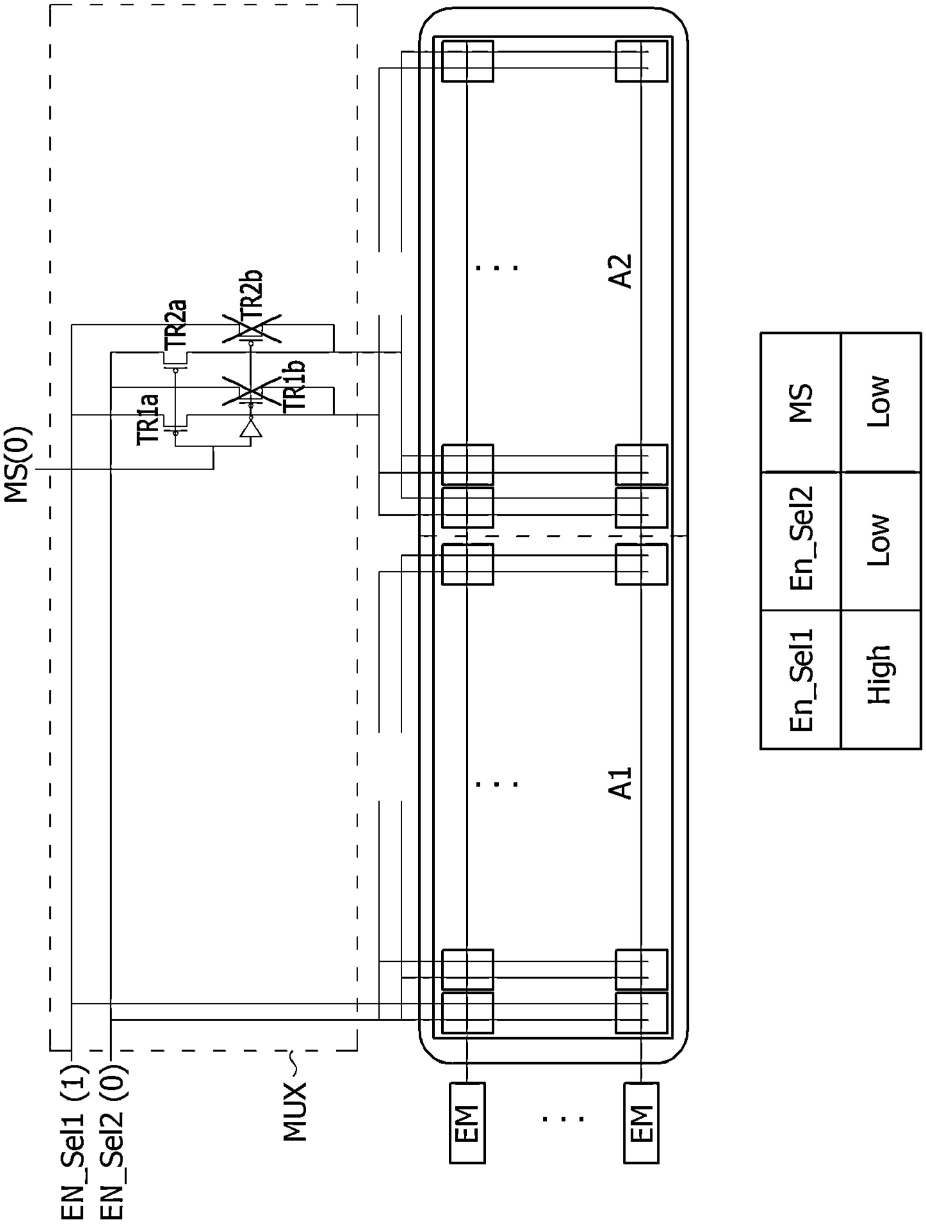

【FIG. 14】
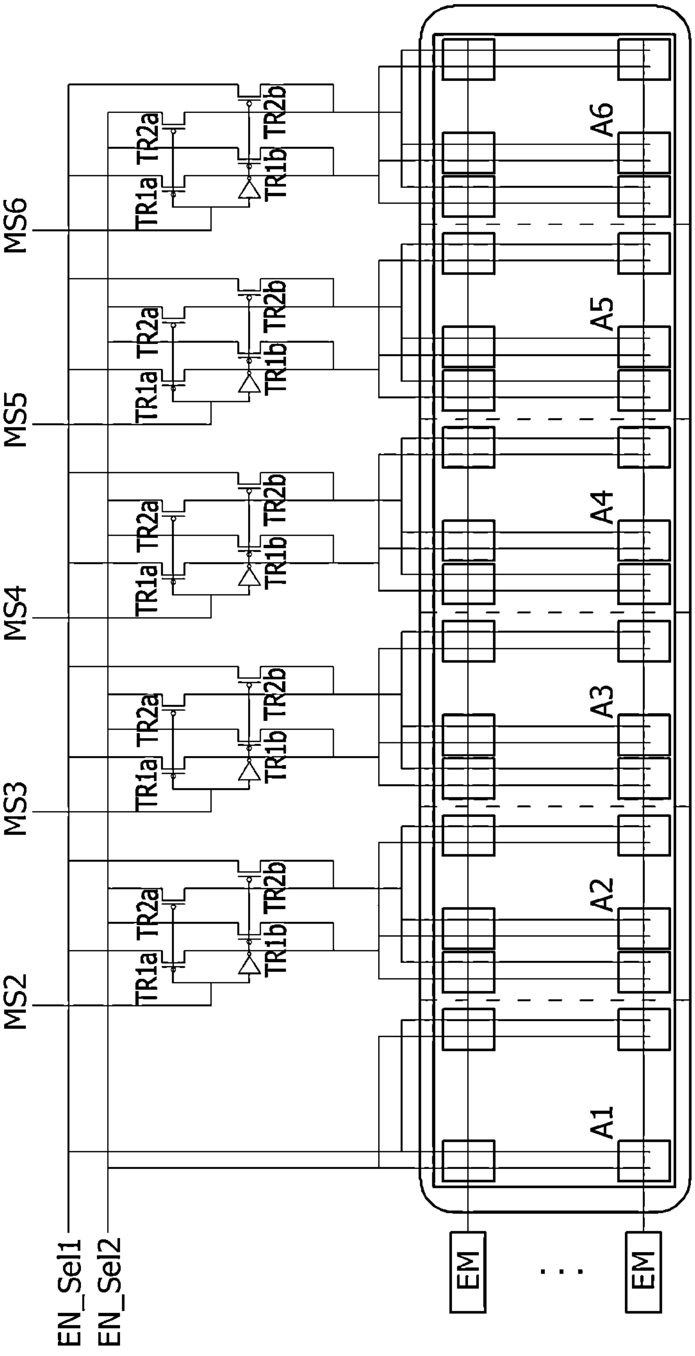

【FIG. 15】
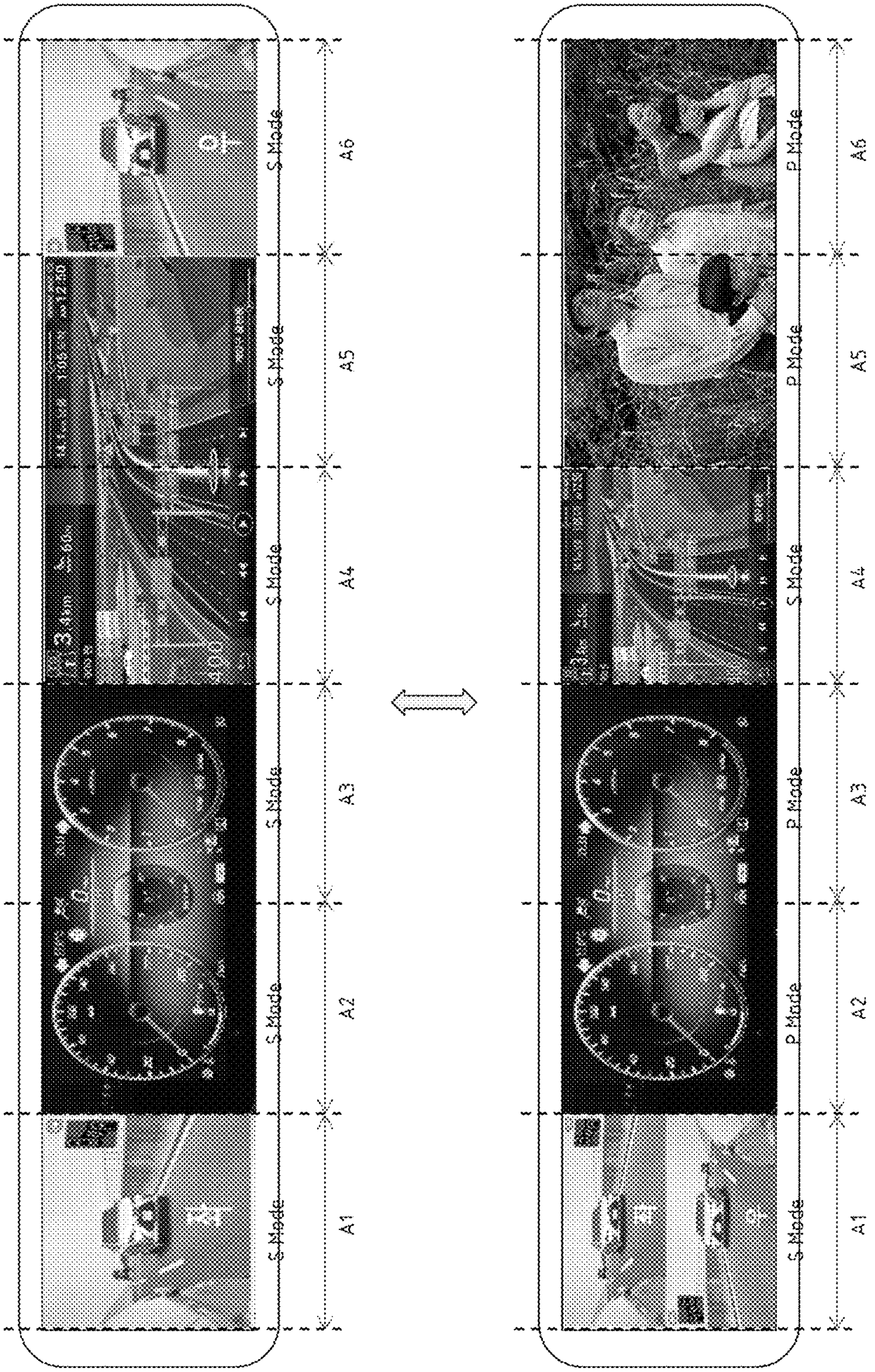

PIXEL CIRCUIT, DISPLAY PANEL AND DISPLAY DEVICE INCLUDING THE SAME

CROSS-REFERENCE TO RELATED APPLICATION

This application claims priority to and the benefit of Korean Patent Application No. 10-2022-0188950, filed on Dec. 29, 2022, the disclosure of which is incorporated herein by reference in its entirety for all purposes as if fully set forth into the present application.

BACKGROUND

1. Technical Field

The present disclosure relates to a device, and particularly to, for example, without limitation a pixel circuit, a display panel and a display device including the same.

2. Discussion of the Related Art

The market for autonomous vehicles is expanding. The autonomous vehicles are demanding changes in the market for vehicle displays that allow users to enjoy various entertainment in a vehicle. In the case of a vehicle having an autonomous driving function, a vehicle display with a large screen is provided. Various visual information such as driving information and entertainment information may be displayed together on a screen of the vehicle display.

The description provided in the background section should not be assumed to be prior art merely because it is mentioned in or associated with the background section. The background section may include information that describes one or more aspects of the subject technology.

SUMMARY

Research is being conducted on a method of dividing the screen of the vehicle display, and controlling a part of the screen with a narrow viewing angle and the other part thereof with a wide viewing angle. This technology may allow a personal content image, which can be viewed only by a specific user, to be displayed by driving pixels having a narrow viewing angle and disposed in a partial area of the screen, and simultaneously, allow a shared content image, which can be viewed by multiple users, to be displayed by driving pixels having a wide viewing angle and disposed in the other area of the screen. However, in this technology, it difficult to adjust the viewing angle for each area of the screen as desired.

The present disclosure is directed to solving all the above-described necessity and problems.

Accordingly, embodiments of the present disclosure are directed to a pixel circuit, a display panel and a display device including the same that substantially obviates one or more of the problems due to limitations and disadvantages of the related art.

An aspect of the present disclosure is to provide a pixel circuit capable of switching between a share mode and a privacy mode, and a display device including the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a pixel circuit may comprise a first light-emitting element, a second light-emitting element, a driving element configured to generate a driving current of each of the first and second light-emitting elements, a first switch element connected between the driving element and a first node and turned on in response to a gate signal, a second switch element connected between the first node and the first light-emitting element and turned on in response to a first mode selection signal, and a third switch element connected between the first node and the second light-emitting element and turned on in response to a second mode selection signal, wherein the first light-emitting element emits light at a first viewing angle, and the second light-emitting element emits light at a second viewing angle smaller than the first viewing angle.

A display panel according to an exemplary embodiment of the present disclosure may include a plurality of pixel circuits as mentioned above.

In another aspect, a display device may comprise a display panel including a first display area and a second display area each having a plurality of pixel circuits disposed therein, wherein each of the pixel circuits may include a first light-emitting element, a second light-emitting element, a driving element configured to generate a driving current of each of the first and second light-emitting elements, a first switch element connected between a gate electrode of the driving element and a power line through which a reference voltage is applied, and including a gate electrode connected to a common gate line, a second switch element connected between the driving element and the first light-emitting element, and a third switch element connected between the driving element and the second light-emitting element.

In another aspect, a display device may comprise a display panel including a first display area and a second display area each having a plurality of pixel circuits disposed therein, wherein each of the pixel circuits may include a first light-emitting element, a second light-emitting element, a driving element configured to generate a driving current of each of the first and second light-emitting elements, a first switch element connected between the driving element and a first node and turned on in response to a gate signal, a second switch element connected between the first node and the first light-emitting element and turned on in response to a first mode selection signal, and a third switch element connected between the first node and the second light-emitting element and turned on in response to a second mode selection signal.

According to the present disclosure, by dividing a display area into a plurality of display areas, configuring a MUX switch unit connected to pixel circuits disposed in the plurality of display areas, and selectively driving a first light-emitting element and a second light-emitting element of the pixel circuit disposed in each display area in response to a mode selection signal output from the MUX switch unit, it is possible to set a share mode and a privacy mode for each display area and to switch between the two modes.

The effects of the present disclosure are not limited to the above-mentioned effects, and other effects that are not mentioned will be apparently understood by those skilled in the art from the following description and the appended claims.

It is to be understood that both the foregoing general description and the following detailed description are exemplary and explanatory and are intended to provide further explanation of the inventive concepts as claimed.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIG. 1 is a block diagram illustrating a display device according to an exemplary embodiment of the present disclosure;

FIG. 2 is a circuit diagram illustrating a pixel circuit according to a first exemplary embodiment of the present disclosure;

FIG. 3 is a view illustrating lenses disposed on first and second light-emitting elements shown in FIG. 2 according to a first exemplary embodiment of the present disclosure;

FIGS. 4A and 4B are waveform diagrams illustrating gate signals applied to the pixel circuit shown in FIG. 2 according to a first exemplary embodiment of the present disclosure;

FIGS. 5 to 6D are diagrams for describing a mode switching principle according to the first exemplary embodiment:

FIG. 7 is a view illustrating information reproduced on a screen of a display device according to the first exemplary embodiment;

FIG. 8 is a circuit diagram illustrating a pixel circuit according to a second exemplary embodiment of the present disclosure;

FIGS. 9 to 13D are diagrams for describing a mode switching principle according to the second exemplary embodiment;

FIG. 14 is a view for describing a mode switching principle according to a third exemplary embodiment; and FIG. 15 is a view illustrating information reproduced on a screen of a display device according to the third exemplary embodiment.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Names of the respective elements used in the following explanations may be selected only for convenience of writing the specification and may be thus different from those used in actual products.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

Any implementation described herein as an "example" is not necessarily to be construed as preferred or advantageous over other implementations.

The terms such as "comprising," "including." "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms, such as "below," "lower," "above," "upper" and the like, may be used herein to describe a relationship between element(s) as illustrated in the drawings. It will be understood that the terms are spatially relative and based on the orientation depicted in the drawings.

The terms "first," "second," "A," "B," "(a)," and "(b)," and the like may be used to distinguish components from each other, but the functions or structures of the components are not limited by ordinal numbers or component names in front of the components.

The term "at least one" should be understood as including any and all combinations of one or more of the associated listed items. For example, the meaning of "at least one of a first item, a second item, and a third item" encompasses the combination of all three listed elements, combinations of any two of the three elements, as well as each individual element, the first element, the second element, and the third element.

The same reference numerals may refer to substantially the same elements throughout the present disclosure.

The following embodiments can be partially or entirely bonded to or combined with each other and can be linked and operated in technically various ways. The embodiments can be carried out independently of or in association with each other.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, various embodiments of the present disclosure will be described in detail with reference to the accompanying drawings.

FIG. 1 is a block diagram illustrating a display device according to an exemplary embodiment of the present disclosure.

Referring to FIG. 1, a display device according to an exemplary embodiment of the present disclosure may include a display panel 100 and a display panel driving circuit.

A screen of the display panel 100 may include a pixel array AA that displays pixel data of an input image. The pixel data of the input image is displayed on pixels of the pixel array AA. The pixel array AA may include a plurality of data lines DL, a plurality of gate lines GL intersecting the data lines DL, and the pixels disposed in a matrix form. In addition to the matrix form, the pixels may be disposed in various forms, such as a form in which pixels emitting the same color are shared, a stripe form, a diamond form, and the like.

When the pixel array AA has a resolution of n*m, the pixel array AA includes n pixel columns and m pixel lines L1 to Lm that intersect the pixel columns. The pixel line includes pixels arranged in a first direction X. The pixel column includes pixels arranged in a second direction Y. One horizontal period 1H is a time obtained by dividing one frame period by the number of m pixel lines L1 to Lm, without being limited thereto. As an example, pixel data is written to pixels of one pixel line in one horizontal period 1H.

Each of the pixels includes two or more sub-pixels 101 for color implementation. For example, each of the pixels may be divided into a red sub-pixel, a green sub-pixel, and a blue sub-pixel. Each of the pixels may further include a white sub-pixel. Embodiments are not limited thereto. Sub-pixels of different combination of colors, such as cyan, magenta and yellow, are also possible. Each of the sub-pixels 101 includes a pixel circuit. The pixel circuit includes a pixel electrode, one or more thin-film transistors (TFTs), and a capacitor. The pixel circuit is connected to the data line DL and the gate line GL.

Touch sensors may be optionally disposed on the display panel 100 to implement a touch screen. A touch input may be sensed using separate touch sensors or through the pixels. The touch sensors may be implemented as on-cell type or add-on type touch sensors, which are arranged on the screen of the display panel, or may be implemented as in-cell type touch sensors, which are embedded in the pixel array.

The display panel driving circuit writes data of an input image to the pixels of the display panel 100 under the control of a timing controller 130. The display panel driving circuit includes a data driving unit 110, a gate driving unit 120L and 120R, the timing controller 130 for controlling operation timings of the driving units 110, 120L and 120R, and level shifters 140L and 140R connected between the timing controller 130 and the gate driving unit 120L and 120R. The display panel driving circuit further includes a power supply unit 300.

The data driving unit 110 converts pixel data of an input image received as a digital signal from a external device such as the timing controller 130 into an analog gamma compensation voltage for each frame to output data signals Vdata1 to Vdata3. The data signals Vdata1 to Vdata3 output from the data driving unit 110 are supplied to the data lines DL. The data driving unit 110 outputs the data signals Vdata1 to Vdata3 using a digital-to-analog converter (hereinafter referred to as a "DAC") that converts the digital signal into the analog gamma compensation voltage. As an example, the data driving unit 110 may be integrated in a source driver integrated circuit (IC). The source driver IC may be mounted on a chip-on-film (COF) and connected between source printed circuit boards (PCBs) and the display panel 100, without being limited thereto. As an example, the source driver IC may be disposed in a chip on glass (COG), a tape carrier package (TCP) manner, or the like depending on a mounting method. Optionally, a touch sensor driving unit for driving the touch sensors may be embedded in each source driver IC.

The display panel driving circuit may further optionally include a demultiplexer array 112 disposed between the data driving unit 110 and the data lines DL.

The demultiplexer array 112 may time-divide a data signal output from one channel of the data driving unit 110 and distribute the time-divided data signal to the data lines DL by sequentially connecting the one channel of the data driving unit 110 to the plurality of data lines DL, thereby reducing the number of channels of the data driving unit 110.

Alternatively, the demultiplexer array 112 may sequentially supply the data voltages outputted from the channels of the data driving unit 110 to the data lines 102 using a plurality of demultiplexers DEMUX. The demultiplexer may include a plurality of switch elements disposed on the display panel 100. When the demultiplexer is disposed between the data lines 102 and the output terminals of the display panel 100, the number of channels of the display panel 100 may be reduced. The demultiplexer array 112 may be omitted.

The gate driving unit 120L and 120R may be formed in a bezel area BZ in which an image is not displayed on the display panel 100, or at least a part of the gate driving unit 120L and 120R may be arranged in the pixel array AA, without being limited thereto. For example, the gate driving unit 120L and 120R may also be disposed in a chip on glass (COG), a chip on film (COF), a tape carrier package (TCP) manner, or the like depending on a mounting method. The gate driving unit 120L and 120R receives a clock transmitted from the level shifters 140L and 140R and outputs a gate pulse GATE. The gate pulse GATE is supplied to the gate lines GL.

The gate pulse GATE applied to the gate lines GL turns on switch elements of the sub-pixels 101 to select pixels to which voltages of the data signals Vdata1 to Vdata3 are charged. The switch element of the sub-pixel 101 is turned on in response to a gate-on voltage VGL of the gate pulse GATE, and is turned off according to a gate-off voltage VGH. The gate pulse GATE swings between the gate-on voltage VGL and the gate-off voltage VGH. As an example, the gate driving unit 120L and 120R shifts the gate pulse using shift registers.

The gate driving unit 120L and 120R according to the exemplary embodiment may include a first gate driving unit 120L and a second gate driving unit 120R, without being limited thereto. As an example, the gate driving unit may include one single gate driving unit, or more than two gate driving units.

The first gate driving unit 120L may include a 1Lth shift register configured to sequentially output a first gate signal EM1, a second shift register configured to sequentially output a second gate signal EM2, and a third shift register configured to sequentially output a third gate signal EM3.

The second gate driving unit 120R may include a 1Rth shift register configured to sequentially output the first gate signal EM1, a fourth shift register configured to sequentially output a fourth gate signal EM4, and a fifth shift register configured to sequentially output a fifth gate signal EM5. Embodiments are not limited thereto. As an example, only one of the first gate driving unit 120L and the second gate driving unit 120R may output the first gate signal EM1.

The timing controller 130 may multiply an input frame frequency by i and control the operation timing of the driving units 110, 120L and 120R in the display panel with the frame frequency of the input frame frequency x*I Hz (here "i" is a positive integer greater than 0). The frame frequency is 60 Hz in the National Television Standards Committee (NTSC) scheme and 50 Hz in the Phase-Alternating Line (PAL) scheme, but the frame frequency is not limited thereto.

The timing controller 130 receives pixel data of an input image and timing signals synchronized with the pixel data, for example, from a host system 200. The pixel data of the input image received by the timing controller 130 is a digital signal. The timing controller 130 transmits the pixel data to the data driving unit 110. The timing signals include a vertical synchronization signal Vsync, a horizontal synchronization signal Hsync, a clock signal DCLK, a data enable signal DE, and the like. The vertical synchronization signal Vsync and the horizontal synchronization signal Hsync may be omitted since a vertical period and a horizontal period may be obtained by a method of counting the data enable signal DE. The data enable signal DE has a period of one horizontal period 1H, without being limited thereto.

The timing controller 130 may generate a data timing control signal for controlling the data driving unit 110, a gate timing control signal for controlling the gate driving unit 120L and 120R, a control signal for controlling the switching elements of the demultiplexer array 112, and the like based on the timing signals received from the host system 200. The gate timing control signal may be generated as a clock of a digital signal voltage level.

The host system 200 may be one among a television (TV), a set-top box, a navigation system, a personal computer (PC), a home theater device, a mobile system, and a wearable system, etc. In the mobile system and the wearable system, the data driving unit 110, the timing controller 130, the level shifters 140L and 140R, and the like may be integrated in a single driver IC (not shown), without being limited thereto. In the mobile system, the host system 200 may be implemented as an application processor (AP). The host system 200 may transmit pixel data of an input image to the driver IC through a mobile industry processor interface (MIPI), etc. The host system 200 may be connected to the driver IC through a flexible printed circuit, for example, a flexible printed circuit board (FPCB), without being limited thereto.

The clocks output from the level shifters 140L and 140R swing between the gate-on voltage VGL and the gate-off voltage VGH and are supplied to the gate driving units 120L and 120R through clock lines CL. The clocks output from the level shifters 140L and 140R may be applied to at least one of the demultiplexer array 112, the gate driving unit 120L and 120R, the data driving unit 110, and the touch sensor driving unit.

The power supply unit 300 generates voltages required for driving the pixel array and the display panel driving circuit of the display panel 100, for example, by using a DC-DC converter. The DC-DC converter may include a charge pump, a regulator, a buck converter, a boost converter, a buck-boost converter, and the like. The power supply unit 300 may adjust a DC input voltage output from the host system 200 to generate DC voltages such as a gamma reference voltage VGMA, the gate-on voltage VGL, the gate-off voltage VGH, common voltages of the pixels, and the like. The power supply unit 300 may generate constant voltages commonly applied to the pixels, for example, a pixel driving voltage EVDD and a pixel base voltage EVSS. The power supply unit 300 may change a voltage level of an output voltage according to a control signal VC, for example, generated from the timing controller 130.

FIG. 2 is a circuit diagram illustrating a pixel circuit according to a first exemplary embodiment of the present disclosure. A pixel circuit illustrated in FIG. 2 illustrates an arbitrary sub-pixel circuit disposed in an Nth pixel line (where N is a natural number). The pixel circuit includes an internal compensation circuit that senses a threshold voltage Vth of a driving element DT and compensates for a data voltage Vdata by the threshold voltage Vth of the driving element DT. The pixel circuit of the present disclosure is not limited to that in FIG. 2. FIG. 3 is a view illustrating lenses disposed on first and second light-emitting elements shown in FIG. 2.

Referring to FIGS. 2 and 3, the pixel circuit includes a first light-emitting element EL1 configured to emit light in a first mode SMODE, a second light-emitting element EL2 configured to emit light in a second mode PMODE, a driving element DT configured to drive the first and second light-emitting elements EL1 and EL2, a plurality of switch elements T1 to T6, and a capacitor Cst. The driving element DT and the switch elements T1 to T6 may be implemented as p-channel transistors, but the present disclosure is not limited thereto. As an example, any of the driving element DT and the switch elements T1 to T6 may be implemented as a p-channel transistor or a n-channel transistor.

The pixel circuit is connected to the data line DL through which the data voltage Vdata is applied, and gate lines GL1 to GL5 through which gate signals SCAN1, SCAN2, EM1, EM2, and EM3 are applied.

The pixel circuit is connected to power nodes, to which direct current (DC) voltages (or constant voltages) are applied, such as a first constant voltage node PL1 to which the pixel driving voltage EVDD is applied, a second constant voltage node PL2 to which the pixel base voltage EVSS is applied, and a third constant voltage node PL3 to which a reference voltage Vref is applied. Power lines to which the constant voltage nodes are connected may be commonly connected to all the pixels on the display panel 100, without being limited thereto. As an example, power lines to which the constant voltage nodes are connected may be separately connected to the pixels in different areas on the display panel 100.

The pixel driving voltage EVDD is set to a voltage, which is higher than the maximum voltage of the data voltage Vdata and allows the driving element DT to operate in a saturation region. The pixel driving voltage EVDD is a voltage higher than the pixel base voltage EVSS. The reference voltage Vref may be set to a voltage that is lower than the pixel driving voltage EVDD and higher than the pixel base voltage EVSS. A gate-off voltage VGH may be set to a voltage higher than the pixel driving voltage EVDD and a gate-on voltage VGL may be set to a voltage lower than the pixel base voltage EVSS, without being limited thereto. As an example, gate-off voltage VGH may be set to a voltage equal to or lower than the pixel driving voltage EVDD, and a gate-on voltage VGL may be set to a voltage equal to or higher than the pixel base voltage EVSS, as long as the gate-off voltage VGH may turn off the corresponding transistor, and the gate-on voltage VGL may turn on the corresponding transistor. Furthermore, depending on the type of the transistor, as an example, a gate-on voltage VGL may be set to a voltage higher than the pixel driving voltage EVDD and a gate-off voltage VGH may be set to a voltage lower than the pixel base voltage EVSS, without being limited thereto. For example, EVDD=13[V], EVSS-O[V], Vref=2.5 [V], VGH=14[V], and VGL=−9[V], but the present disclosure is not limited thereto.

The gate signals SCAN1, SCAN2, EM1, EM2, and EM3 may include a pulse that swings between the gate-on voltage VGL and the gate-off voltage VGH.

The driving element DT drives the first and second light-emitting elements EL1 and EL2 by generating a current according to a gate-source voltage Vgs. The driving element DT includes a first electrode connected to the first constant voltage node PL1 to which the pixel driving voltage EVDD is applied, a gate electrode connected to a second node n2, and a second electrode connected to a third node n3.

The first and second light-emitting elements EL1 and EL2 may be implemented as organic light-emitting diodes (OLEDs). Each of the light-emitting elements EL1 and EL2 includes an anode, a cathode, and an organic compound layer formed between the anode and the cathode. The anode of the first light-emitting element EL1 is connected to a fourth node n4, and the cathode thereof is connected to the second constant voltage node PL2 to which the pixel base voltage EVSS is applied. The anode of the second light-emitting element EL2 is connected to a fifth node n5, and the cathode thereof is connected to the second constant voltage node PL2. The organic compound layer may include an emission layer EML. As an example, the organic compound layer may further include at least one of a hole injection layer HIL, a hole transport layer HTL, an electron transport layer ETL, and an electron injection layer EIL, but the present disclosure is not limited thereto. As an example, each of the light-emitting elements EL1 and EL2 may be implemented in a tandem structure in which a plurality of light-emitting layers are stacked. The light-emitting elements EL1 and EL2 of the tandem structure can improve the luminance and lifetime of the pixel.

The capacitor Cst may be connected between a first node n1 and the second node n2. In a sensing period SEN, the data voltage Vdata compensated by a threshold voltage Vth of the driving element DT is stored in the capacitor Cst. The capacitor Cst maintains the gate-source voltage Vgs of the driving element DT during a light-emitting period EMIS.

A first switch element T1 may be connected between the data line DL and the first node n1. The first switch element T1 is turned on according to a gate-on voltage VGL of a first gate signal SCAN1 to apply the data voltage Vdata of pixel data to the capacitor Cst. The first switch element T1 includes a first electrode connected to the data line DL, a gate electrode connected to a first gate line GL1 through which the first gate signal SCAN1 is applied, and a second electrode connected to the first node n1.

A second switch element T2 may be connected between the second node n2 and the third node n3. The second switch element T2 is turned on according to a gate-on voltage VGL of a second gate signal SCAN2 to connect the gate electrode and second electrode of the driving element DT. The second switch element T2 includes a first electrode connected to the second node n2, a gate electrode connected to a second gate line GL2 through which the second gate signal SCAN2 is applied, and a second electrode connected to the third node n3.

A third-first switch element T31 may be connected between the fourth node n4 and the third constant voltage node PL3. The third-first switch element T31 is turned on according to the gate-on voltage VGL of the second gate signal SCAN2 to connect the fourth node n4 to the third constant voltage node PL3 to which the reference voltage Vref is applied. The third-first switch element T31 includes a first electrode connected to the third constant voltage node PL3, a gate electrode connected to the second gate line GL2, and a second electrode connected to the fourth node n4.

A third-second switch element T32 may be connected between the fifth node n5 and the third constant voltage node PL3. The third-second switch element T32 is turned on according to the gate-on voltage VGL of the second gate signal SCAN2 to connect the fifth node n5 to the third constant voltage node PL3 to which the reference voltage Vref is applied. The third-second switch element T32 includes a first electrode connected to the third constant voltage node PL3, a gate electrode connected to the second gate line GL2, and a second electrode connected to the fifth node n5.

A fourth switch element T4 may be connected between the first node n1 and the third constant voltage node PL3. The fourth switch element T4 is turned on according to a gate-on voltage VGL of a third gate signal EM1 to connect the first node n1 to the third constant voltage node PL3. The fourth switch element T4 includes a first electrode connected to the first node n1, a gate electrode connected to a third gate line GL3 through which the third gate signal EM1 is applied, and a second electrode connected to the third constant voltage node PL3.

A fifth switch element T5 may be connected between the third node n3 and the fourth node n4. The fifth switch element T5 is turned on according to a gate-on voltage VGL of a fourth gate signal EM2 to connect the third node n3 to the fourth node n4. The fifth switch element T5 includes a first electrode connected to the third node n3, a gate electrode connected to a fourth gate line GL4 through which the fourth gate signal EM2 is applied, and a second electrode connected to the fourth node n4.

A sixth switch element T6 may be connected between the third node n3 and the fifth node n5. The sixth switch element T6 is turned on according to a gate-on voltage VGL of a fifth gate signal EM3 to connect the third node n3 to the fifth node n5. The sixth switch element T6 includes a first electrode connected to the third node n3, a gate electrode connected to a fifth gate line GL5 through which a fifth gate signal EM3 is applied, and a second electrode connected to the fifth node n5.

As shown in FIG. 3, a first lens LENS1 shown in FIG. 3 may be disposed on the first light-emitting element EL1. The first lens LENS1 may be a semi-cylindrical lens in order to limit a vertical viewing angle and widen a horizontal viewing angle. The first lens LENS1 is long in a horizontal direction (or an X-axis direction) of the display panel 100 and narrow in a vertical direction of the display panel 100. The first lens LENS1 may have a hemispherical cross section, without being limited thereto. The first lens condenses light traveling in the vertical direction among light of the first light-emitting element EL1 emitted in the first mode to narrow the vertical viewing angle and widen the horizontal viewing angle. By the first lens LENS1, the vertical viewing angle of the first light-emitting element EL1 is comparable to (e.g., equal to) that of the second light-emitting element EL2, and the horizontal viewing angle thereof is larger than that of the second light-emitting element EL2. In FIG. 3, “R” indicates a red sub-pixel that emits light, “G” indicates a green sub-pixel that emits light, and “B” indicates a blue sub-pixel that emits light. The sub-pixels darkly expressed in FIG. 3 are non-driving sub-pixels that do not emit light. Embodiments are not limited thereto. As an example, as long as the horizontal viewing angle of the first light-emitting element EL1 is different from than that of the second light-emitting element EL2, the first lens LENS1 and the second lens LENS2 may have various shapes.

Light emitted from a screen of a vehicle display, which for example is disposed on a dashboard or other position of a vehicle, may travel to a front-facing camera, which for example is disposed in front of an upper end of a room or other position in the vehicle, and the screen of the vehicle display may be seen in an image captured by the front-facing camera. The first lens LENS1 limits the vertical viewing angle of the first light-emitting element EL1 that emits light in the first mode to reduce or prevent a ghost image of the screen of the vehicle display, which is captured by the front-facing camera.

A second lens LENS2 shown in FIG. 3 may be disposed on the second light-emitting element EL2. The second lens LENS2 may be a semi-spherical lens whose thickness is larger at the center and smaller toward an edge thereof. The second lens LENS2 may condense light of the second light-emitting element EL2 emitted in the second mode to narrow a vertical viewing angle and a horizontal viewing angle of the second light-emitting element EL2.

The first and second lenses LENS1 and LENS2 may be implemented as transparent media or transparent insulating layer patterns disposed in the display panel 100, but the present disclosure is not limited thereto.

The first light-emitting element EL1 emits light at a first viewing angle due to the first lens LENS1, and the second light-emitting element EL2 emits light at a second viewing angle smaller than the first viewing angle due to the second lens LENS2.

But embodiments are not limited thereto. As an example, the first light-emitting element EL1 per se may have a viewing angle different from that of the second light-emitting element EL2 per se, without providing any lens. Alternatively, as an example, only one of the first light-emitting element EL1 and the second light-emitting element EL2 may be provided with a lens.

As shown in FIGS. 4A and 4B, the pixel circuit is driven in the order of an initialization period INI, the sensing period SEN, and the light-emitting period EMIS. The initialization period INI, the sensing period SEN, and the light-emitting period EMIS may be determined by waveforms of the gate signals SCAN1, SCAN2, EM1, EM2, and EM3.

FIGS. 4A and 4B are waveform diagrams illustrating gate signals applied to the pixel circuit shown in FIG. 2. FIG. 4A illustrates gate signals generated in the first mode SMODE, and FIG. 4B illustrates gate signals generated in the second mode PMODE.

The first, second, and third gate signals SCAN1, SCAN2, and EM1 are common gate signals generated at the same timing in the first and second modes SMODE and PMODE.

The fourth gate signal EM2 may be generated with the gate-on voltage VGL during the initialization period INI and the light-emitting period EMIS of the first mode SMODE. When the fourth gate signal EM2 is generated with the gate-on voltage VGL during the light-emitting period EMIS of the first mode SMODE, the first light-emitting element EL1 may be driven in the first mode SMODE and may emit light. The fifth gate signal EM3 is maintained at the gate-off voltage VGH in the first mode SMODE. Accordingly, the second light-emitting element EL2 is not driven in the first mode SMODE and is maintained in the off state.

The fifth gate signal EM3 may be generated with the gate-on voltage VGL during the initialization period INI and the light-emitting period EMIS of the second mode PMODE. When the fifth gate signal EM3 is generated with the gate-on voltage VGL during the light-emitting period EMIS of the second mode PMODE, the second light-emitting element EL2 may be driven in the second mode PMODE and may emit light. The fourth gate signal EM2 is maintained at the gate-off voltage VGH in the second mode PMODE. Accordingly, the first light-emitting element EL1 is not driven in the second mode PMODE and is maintained in the off state.

The voltage of each of the second to fourth gate signals SCAN2, EM1, and EM2 is the gate-on voltage VGL during the initialization period INI of the first mode SMODE. The voltage of each of the first and fifth gate signals SCAN1 and EM3 during the initialization period INI of the first mode SMODE is the gate-off voltage VGH. Accordingly, the second to fifth switch elements T2 to T5 are turned on during the initialization period INI of the first mode SMODE while the first and sixth switch elements T1 to T6 are turned off. At this time, the voltage of each of the first, third, fourth, and fifth nodes n1, n3, n4, and n5 is initialized to the reference voltage Vref, and the gate-source voltage Vgs of the capacitor Cst and the driving element DT and an anode voltage of each of the light-emitting elements EL1 and EL2 are initialized.

The voltage of each of the second, third, and fifth gate signals SCAN2, EM1, and EM3 is the gate-on voltage VGL during the initialization period INI of the second mode PMODE. The voltage of each of the first and fourth gate signals SCAN1 and EM2 during the initialization period INI of the second mode PMODE is the gate-off voltage VGH. Accordingly, during the initialization period INI of the second mode PMODE, the second, third-first, third-second, fourth, and sixth switch elements T2, T31, T32, T4, and T6 are turned on while the first and fifth switch elements T1 and T5 are turned off. At this time, the voltage of each of the first, third, fourth, and fifth nodes n1, n3, n4, and n5 is initialized to the reference voltage Vref, and the gate-source voltage Vgs of the capacitor Cst and the driving element DT and the anode voltage of each of the light-emitting elements EL1 and EL2 are initialized.

In the first and second modes SMODE and PMODE, the pulse of the first gate signal SCAN1 synchronized with the data voltage Vdata of the pixel data is input to the pixel circuit during the sensing period SEN. The voltage of the pulse of the first gate signal SCAN1 is the gate-on voltage VGL for one horizontal period 1H. During the sensing period SEN, the voltage of the second gate signal SCAN2 is the gate-on voltage VGL and the voltage of each of the third to fifth gate signals EM1, EM2, and EM3 is the gate-off voltage VGH. Accordingly, during the sensing period SEN of the first mode SMODE, the first to third-second switch elements T1, T2, T31, and T32 are turned on while the fourth to sixth switch elements T4, T5, and T6 are turned off.

During the sensing period SEN, the data voltage Vdata may be applied to the first node n1, and the driving element DT is turned on so that the voltage of the third node n3 is increased. During the sensing period SEN, the driving element DT is turned off when the gate voltage of the driving element DT rises and the gate-source voltage Vgs reaches the threshold voltage Vth of the driving element DT. At this time, "Vdata-EVDD+Vth" is stored in the capacitor Cst. Here, "Vth" is the threshold voltage Vth of the driving element DT.

A floating time may be set for a predetermined time between the sensing period SEN and the light-emitting period EMIS. During the floating time, the voltage of each of the gate signals SCAN1, SCAN2, EM1, EM2, and EM3 is the gate-off voltage VGH. Accordingly, during the floating time, the major nodes n1 to n4 are floated, and the threshold voltage Vth of the driving element DT may be sensed at the pixels, which have insufficient time to sense the threshold voltage of the driving element DT within one horizontal period 1H.

During the light-emitting period EMIS of the first mode SMODE, the voltage of each of the third and fourth gate signals EM1 and EM2 is the gate-on voltage VGL and the voltage of each of the first, second, and fifth gate signals SCAN1, SCAN2, and EM3 is the gate-off voltage VGH. Accordingly, during the light-emitting period EMIS of the first mode SMODE, the fourth and fifth switch elements T4 and T5 are turned on together with the driving element DT, while the first to third-second switch elements T1, T2, T31, and T32 and the sixth switch element T6 are turned off.

During the light-emitting period EMIS of the first mode SMODE, the voltage of the first node n1 may change to the reference voltage Vref, and the voltage of the second node n2 changes to "Vref-Vdata+EVDD+Vth." During the light-emitting period EMIS of the first mode SMODE, the driving element DT supplies a current generated according to the gate-source voltage Vgs to the first light-emitting element EL1. During the light-emitting period EMIS of the first mode SMODE, the first light-emitting element EL1 emits light at a brightness corresponding to a grayscale value of the pixel data, and the light passes through the first lens LENS1 and is emitted at a large angle in the horizontal direction.

During the light-emitting period EMIS of the second mode PMODE, the voltage of each of the third and fifth gate signals EM1 and EM3 is the gate-on voltage VGL, and the voltage of each of the first, second, and fourth gate signals SCAN1, SCAN2, and EM2 is the gate-off voltage VGH. Accordingly, during the light-emitting period EMIS of the second mode PMODE, the fourth and sixth switch elements T4 and T6 are turned on together with the driving element DT, while the first to third-second switch elements T1, T2, T31, and T32 and the fifth switch element T5 are turned off.

During the light-emitting period EMIS of the second mode PMODE, the voltage of the first node n1 changes to the reference voltage Vref, and the voltage of the second node n2 changes to "Vref-Vdata+EVDD+Vth." During the light-emitting period EMIS of the second mode PMODE, the driving element DT supplies a current generated according to the gate-source voltage Vgs to the second light-emitting element EL2. The second light-emitting element EL2 emits light at a brightness corresponding to a grayscale value of the pixel data during the light-emitting period EMIS of the second mode PMODE, and the light is condensed by the second lens LENS2 at a small angle in the vertical direction and the horizontal direction.

FIGS. 5 to 6D are diagrams for describing a mode switching principle according to the first exemplary embodiment, and FIG. 7 is a view illustrating information reproduced on a screen of a display device according to the first exemplary embodiment.

Referring to FIG. 5, source driver ICs D-IC1 and D-IC2 are connected between a circuit board PCB and a display panel 100.

A timing controller (TCON) 130 may be mounted on the circuit board PCB.

Level shifters 140L and 140R may be mounted on the circuit board PCB. Input terminals of the level shifters 140L and 140R are connected to the timing controller 130 through wirings. Output terminals of the level shifters 140L and 140R may be connected to gate driving units 120L and 120R, respectively, through wirings connecting the circuit board PCB and the gate driving units 120L and 120R on the display panel 100.

The gate driving unit 120L is connected to gate lines of a first display area A1 to supply gate signals to pixel circuits disposed in the first display area A1, and the gate driving unit 120R is connected to gate lines of a second display area A2 to supply gate signals to pixel circuits disposed in the second display area A2. Embodiments are not limited thereto. As an example, in the case where there exists one single gate driving unit, the single gate driving unit is connected to gate lines of the overall display area to supply gate signals to pixel circuits disposed in the overall display area.

The gate driving unit 120L may supply a first gate signal EM1, a 2Lth gate signal EM2L, and a 3Lth gate signal EM3L to the pixel circuits disposed in the first display area A1. The gate driving unit 120L includes a 1Lth shift register, a 2Lth shift register, and a 3Lth shift register, wherein the 1Lth shift register supplies the first gate signal EM1, the 2Lth shift register supplies the 2Lth gate signal EM2L, and the 3Lth shift register supplies the 3Lth gate signal EM3L.

The gate driving unit 120R may supply the first gate signal EM1, a 2Rth gate signal EM2R, and a 3Rth gate signal EM3R to the pixel circuits disposed in the second display area A2. The gate driving unit 120R includes a 1Rth shift register, a 2Rth shift register, and a 3Rth shift register, wherein the 1Rth shift register supplies the first gate signal EM1, the 2Rth shift register supplies the 2Rth gate signal EM2R, and the 3Rth shift register supplies the 3Rth gate signal EM3R.

The first gate signal EM1 may be supplied to all of the pixel circuits disposed in the first and second display areas A1 and A2 through common gate lines. The 2Lth gate signal EM2L and the 3Lth gate signal EM3L allow the pixel circuits disposed in the first display area A1 to be driven in a first mode or a second mode, through individual gate lines. In addition, the 2Rth gate signal EM2R and the 3Rth gate signal EM3R allow the pixel circuits disposed in the second display area A2 to be driven in the first mode or the second mode, through individual gate lines.

At this time, the pixel circuits disposed in the first display area A1 and the pixel circuits disposed in the second display area A2 may be driven in different modes or may be driven in the same mode.

Referring to FIGS. 5 and 6A, the gate driving unit 120L supplies the first gate signal EM1 of a low voltage level, the 2Lth gate signal EM2L of a low voltage level, and the 3Lth gate signal EM3L of a high voltage level to the pixel circuits disposed in the first display area A1 to allow the pixel circuits disposed in the first display area A1 to operate in a first mode SMODE.

The gate driving unit 120R may supply the first gate signal EM1 of the low voltage level, the 2Rth gate signal EM2R of a low voltage level, and the 3Rth gate signal EM3R of a high voltage level to the pixel circuits disposed in the second display area A2 to allow the pixel circuits disposed in the second display area A2 to operate in the first mode SMODE.

Accordingly, the first and second display areas A1 and A2 are operated in the first mode SMODE.

Referring to FIGS. 5 and 6B, the gate driving unit 120L supplies the first gate signal EM1 of the low voltage level, the 2Lth gate signal EM2L of a high voltage level, and the 3Lth gate signal EM3L of a low voltage level to the pixel circuits disposed in the first display area A1 to allow the pixel circuits disposed in the first display area A1 to operate in a second mode PMODE.

The gate driving unit 120R may supply the first gate signal EM1 of the low voltage level, the 2Rth gate signal EM2R of the low voltage level, and the 3Rth gate signal EM3R of the high voltage level to the pixel circuits disposed in the second display area A2 to allow the pixel circuits disposed in the second display area A2 to operate in the first mode SMODE.

Accordingly, the first display area A1 is operated in the second mode PMODE, and the second display area A2 is operated in the first mode SMODE.

Referring to FIGS. 5 and 6C, the gate driving unit 120L may supply the first gate signal EM1 of the low voltage level, the 2Lth gate signal EM2L of the low voltage level, and the 3Lth gate signal EM3L of the high voltage level to the pixel circuits disposed in the first display area A1 to allow the pixel circuits disposed in the first display area A1 to operate in the first mode SMODE.

The gate driving unit 120R may supply the first gate signal EM1 of the low voltage level, the 2Rth gate signal EM2R of a high voltage level, and the 3Rth gate signal EM3R of a low voltage level to the pixel circuits disposed in the second display area A2 to allow the pixel circuits disposed in the second display area A2 to operate in the second mode PMODE.

Accordingly, the first display area A1 may be operated in the first mode SMODE, and the second display area A2 is operated in the second mode PMODE.

Referring to FIGS. 5 and 6D, the gate driving unit 120L supplies the first gate signal EM1 of the low voltage level, the 2Lth gate signal EM2L of the high voltage level, and the 3Lth gate signal EM3L of the low voltage level to the pixel circuits disposed in the first display area A1 to allow the pixel circuits disposed in the first display area A1 to operate in the second mode PMODE.

The gate driving unit 120R may supply the first gate signal EM1 of the low voltage level, the 2Rth gate signal EM2R of the high voltage level, and the 3Rth gate signal EM3R of the low voltage level to the pixel circuits disposed in the second display area A2 to allow the pixel circuits disposed in the second display area A2 to operate in the second mode PMODE.

Accordingly, the first and second display areas A1 and A2 may be operated in the second mode PMODE.

In the exemplary embodiment, the display area is divided into the first display area and the second display area as shown in FIG. 7, and the first display area and the second display area may be independently operable in the first mode and the second mode.

FIG. 8 is a circuit diagram illustrating a pixel circuit according to a second exemplary embodiment of the present disclosure.

Referring to FIG. 8, a pixel circuit may include a first light-emitting element EL1 configured to emit light in a first mode SMODE, a second light-emitting element EL2 configured to emit light in a second mode PMODE, a driving element DT configured to drive the first and second light-emitting elements EL1 and EL2, a plurality of switch elements T1 to T7, and a capacitor Cst. The driving element DT and the switch elements T1 to T7 may be implemented as p-channel transistors, but the present disclosure is not limited thereto. As an example, any one of the driving element DT and the switch elements T1 to T7 may be implemented as a p-channel transistor or a n-channel transistor.

The pixel circuit may be connected to a data line DL, through which a data voltage Vdata is applied, and gate lines GL1 to GL5 through which gate signals SCAN1, SCAN2, EM, EN_Sel1, and EN_Sel2 are applied.

The pixel circuit may be connected to power nodes, to which DC voltages (or constant voltages) are applied, such as a first constant voltage node PL1 to which the pixel driving voltage EVDD is applied, a second constant voltage node PL2 to which the pixel base voltage EVSS is applied, and a third constant voltage node PL3 to which the reference voltage Vref is applied. Power lines to which the constant voltage nodes are connected may be commonly connected to all the pixels on the display panel 100, without being limited thereto.

The pixel driving voltage EVDD may be set to a voltage that is higher than the maximum voltage of the data voltage Vdata and allows the driving element DT to operate in a saturation region. The pixel driving voltage EVDD is a voltage higher than the pixel base voltage EVSS. The reference voltage Vref may be set to a voltage that is lower than the pixel driving voltage EVDD and higher than the pixel base voltage EVSS. A gate-off voltage VGH may be set to a voltage higher than the pixel driving voltage EVDD and a gate-on voltage VGL may be set to a voltage lower than the pixel base voltage EVSS, without being limited thereto. For example, EVDD=13[V], EVSS=0[V], Vref=2.5[V], VGH=14[V], and VGL=−9[V], but the present disclosure is not limited thereto.

The gate signals SCAN1, SCAN2, EM, EN_Sel1, and EN_Sel2 may include a pulse that swings between the gate-on voltage VGL and the gate-off voltage VGH.

The driving element DT may drive the first and second light-emitting elements EL1 and EL2 by generating a current according to a gate-source voltage Vgs. The driving element DT includes a first electrode connected to the first constant voltage node PL1 to which the pixel driving voltage EVDD is applied, a gate electrode connected to a second node n2, and a second electrode connected to a third node n3.

The first and second light-emitting elements EL1 and EL2 may be implemented as OLEDs, LEDs, micro-LEDs, etc.

Each of the light-emitting elements EL1 and EL2 includes an anode, a cathode, and an organic compound layer formed between the anode and the cathode. The anode of the first light-emitting element EL1 is connected to a second electrode of a sixth switch element T6, and the cathode thereof is connected to the second constant voltage node PL2 to which the pixel base voltage EVSS is applied. The anode of the second light-emitting element EL2 is connected to a second electrode of a seventh switch element T7, and the cathode thereof is connected to the second constant voltage node PL2. The organic compound layer may include an emission layer EML. As an example, the organic compound layer may further include at least one of a hole injection layer HIL, a hole transport layer HTL, an electron transport layer ETL, and an electron injection layer EIL, but the present disclosure is not limited thereto. As an example, each of the light-emitting elements EL1 and EL2 may be implemented in a tandem structure in which a plurality of light-emitting layers are stacked. The light-emitting elements EL1 and EL2 of the tandem structure can improve the luminance and lifetime of the pixel.

The capacitor Cst may be connected between a first node n1 and the second node n2. In a sensing period SEN, the data voltage Vdata compensated by a threshold voltage Vth of the driving element DT is stored in the capacitor Cst. The capacitor Cst maintains the gate-source voltage Vgs of the driving element DT during a light-emitting period EMIS.

A first switch element T1 may be connected between the data line DL and the first node n1. The first switch element T1 is turned on according to a gate-on voltage VGL of a first gate signal SCAN1 to apply the data voltage Vdata of pixel data to the capacitor Cst. The first switch element T1 includes a first electrode connected to the data line DL, a gate electrode connected to a first gate line GL1 through which the first gate signal SCAN1 is applied, and a second electrode connected to the first node n1.

A second switch element T2 may be connected between the second node n2 and the third node n3. The second switch element T2 is turned on according to a gate-on voltage VGL of a second gate signal SCAN2 to connect the gate electrode and second electrode of the driving element DT. The second switch element T2 includes a first electrode connected to the second node n2, a gate electrode connected to a second gate line GL2 through which the second gate signal SCAN2 is applied, and a second electrode connected to the third node n3.

A third switch element T3 may be connected between the fourth node n4 and the third constant voltage node PL3. The third switch element T3 is turned on according to the gate-on voltage VGL of the second gate signal SCAN2 to connect the fourth node n4 to the third constant voltage node PL3 to which the reference voltage Vref is applied. The third switch element T3 includes a first electrode connected to the third constant voltage node PL3, a gate electrode connected to the second gate line GL2, and a second electrode connected to the fourth node n4.

A fourth switch element T4 may be connected between the first node n1 and the third constant voltage node PL3. The fourth switch element T4 is turned on according to a gate-on voltage VGL of a third gate signal EM to connect the first node n1 to the third constant voltage node PL3. The fourth switch element T4 includes a first electrode connected to the first node n1, a gate electrode connected to a third gate line GL3 through which the third gate signal EM is applied, and a second electrode connected to the third constant voltage node PL3.

A fifth switch element T5 may be connected between the third node n3 and the fourth node n4. The fifth switch element T5 is turned on according to a gate-on voltage VGL of a third gate signal EM to connect the third node n3 to the fourth node n4. The fifth switch element T5 includes a first electrode connected to the third node n3, a gate electrode connected to a third gate line GL3 through which the third gate signal EM is applied, and a second electrode connected to the fourth node n4.

A sixth switch element T6 may be connected between the fourth node n4 and the first light-emitting element EL1. The sixth switch element T6 is turned on according to a gate-on voltage VGL of a first control signal EN_Sel1 to connect the fourth node n4 to the anode of the first light-emitting element EL1. The sixth switch element T6 includes a first electrode connected to the fourth node n4, a gate electrode connected to the fourth gate line GL4 through which the first control signal EN_Sel1 is applied, and a second electrode connected to the anode of the first light-emitting element EL1.

A seventh switch element T7 may be connected between the fourth node n4 and the second light-emitting element EL2. The seventh switch element T7 is turned on according to a gate-on voltage VGL of a second control signal EN_Sel2 to connect the fourth node n4 to the anode of the second light-emitting element EL2. The seventh switch element T7 includes a first electrode connected to the fourth node n4, a gate electrode connected to the fifth gate line GL5 through which the second control signal EN_Sel2 is applied, and a second electrode connected to the anode of the second light-emitting element EL2.

FIGS. 9 to 13D are diagrams for describing a mode switching principle according to the second exemplary embodiment.

Referring to FIGS. 9 and 10, source driver ICs D-IC1 and D-IC2 are connected between a circuit board PCB and a display panel 100.

A timing controller (TCON) 130 may be mounted on the circuit board PCB.

A level shifter 140 (e.g., a level shifter 140L) may be mounted on the circuit board PCB. An input terminal of the level shifter 140 is connected to the timing controller 130 through a wiring. An output terminal of the level shifter 140 may be connected to a gate driving unit 120 through a wiring connecting the circuit board PCB and the gate driving unit 120 on the display panel 100.

The gate driving unit 120 may be connected to gate lines of first and second display areas A1 and A2 to supply gate signals to pixel circuits disposed in the first and second display areas A1 and A2.

A MUX switch unit MUX may be provided on the display panel 100, for example, on a lower portion of the display panel 100. The MUX switch unit MUX drives the pixel circuit disposed in the first and second display areas A1 and A2 in a first mode or a second mode. That is, one of a first light-emitting element and a second light-emitting element constituting the pixel circuit may be selected by using the MUX switch unit MUX and driven in the first mode or the second mode.

For the pixel circuits disposed in the first and second display areas A1 and A2, the mode may be selected using the control signal without using the gate signal.

The pixel circuits disposed in the first display area A1 may be configured in the first mode or the second mode by using the first control signal. The pixel circuits disposed in the second display area A2 may be configured in the first mode or the second mode by using the first control signal and the second control signal.

Referring to FIG. 11A, in the pixel circuit disposed in the first display area A1, a first line is connected to the gate electrode of the sixth switch element for selecting the first light-emitting element EL1, and a second line is connected to the gate electrode of a seventh switch element for selecting the second light-emitting element EL2.

When the first control signal of a gate on voltage level (e.g., low voltage level) is applied to the gate electrode of the sixth switch element, the first light-emitting element emits light and the pixel circuit disposed in the first display area A1 is driven in the first mode.

When the second control signal of a gate off voltage level (e.g., high voltage level) is applied to the gate electrode of the seventh switch element, the second light-emitting element emits light and the pixel circuit disposed in the first display area A1 is driven in the second mode.

Referring to FIG. 11B, in the pixel circuit disposed in the second display area A2, the first line is connected to the gate electrode of the sixth switch element for selecting the first light-emitting element EL1, and the second line is connected to the gate electrode of the seventh switch element for selecting the second light-emitting element EL2.

The first line may include a first-first line and a first-second line, a first-first switch element TR1*a* is disposed on the first-first line to apply the first control signal to the gate electrode of the sixth switch element in response to a mode selection signal, and a first-second switch element TR1*b* is disposed on the first-second line to apply the second control signal to the gate electrode of the sixth switch element in response to the mode selection signal.

At this time, an inverter may be disposed on a gate electrode of the first-second switch element TR1*b* so that an inverted value of the mode selection signal is applied. But embodiments are not limited thereto. As an example, the inverter may be disposed on a gate electrode of the first-first switch element TR1*a* instead of the first-second element TR1*b*, so that an inverted value of the mode selection signal is applied.

The second line may include a second-first line and a second-second line, a second-first switch element is disposed on the second-first line to apply the first control signal to the gate electrode of the seventh switch element in response to the mode selection signal, and a second-second switch element is disposed on the second-second line to apply the second control signal to the gate electrode of the seventh switch element in response to the mode selection signal.

At this time, an inverter may be disposed on a gate electrode of the second-second switch element so that an inverted value of the mode selection signal is applied.

Referring to FIGS. 12 and 13A, when the first control signal of a low voltage level, the second control signal of a high voltage level, and the mode selection signal of a low voltage level are applied, the pixel circuit disposed in the first display area A1 is driven in the first mode, and the pixel circuit disposed in the second display area A2 is driven in the first mode.

Accordingly, the first and second display areas A1 and A2 may be operated in the first mode SMODE.

Referring to FIGS. 12 and 13B, when the first control signal of a high voltage level, the second control signal of a low voltage level, and the mode selection signal of the low voltage level are applied, the pixel circuit disposed in the first display area A1 is driven in the second mode, and the pixel circuit disposed in the second display area A2 is driven in the first mode.

Accordingly, the first display area A1 may be operated in the second mode PMODE, and the second display area A2 is operated in the first mode SMODE.

Referring to FIGS. 12 and 13C, when the first control signal of the low voltage level, the second control signal of the high voltage level, and the mode selection signal of a high voltage level are applied, the pixel circuit disposed in the first display area A1 is driven in the first mode, and the pixel circuit disposed in the second display area A2 is driven in the second mode.

Accordingly, the first display area A1 may be operated in the second mode first mode SMODE, and the second display area A2 is operated in the second mode PMODE.

Referring to FIGS. 12 and 13D, when the first control signal of the high voltage level, the second control signal of the low voltage level, and the mode selection signal of the low voltage level are applied, the pixel circuit disposed in the first display area A1 is driven in the second mode, and the pixel circuit disposed in the second display area A2 is driven in the second mode.

Accordingly, the first and second display areas A1 and A2 may be operated in the second mode PMODE.

FIG. 14 is a view for describing a mode switching principle according to a third exemplary embodiment, and FIG. 15 is a view illustrating information reproduced on a screen of a display device according to the third exemplary embodiment.

Referring to FIG. 14, in a third exemplary embodiment, a case is illustrated, in which a display area is divided into three or more display areas instead of two, and a mode of each display area is switched.

In the third exemplary embodiment, like the configuration of the second exemplary embodiment illustrated in FIG. 9, a mode of a first display area may be switched using a first control signal and a second control signal, and a mode of the remaining display area may be switched using the first control signal, the second control signal, and a mode selection signal.

Although a case in which the display area is divided into six display areas is described as an example, the present disclosure is not limited thereto, and a plurality of display areas may be configured in units of blocks.

In the exemplary embodiment, the display area may be divided into a plurality of display areas as shown in FIG. 15, and each of the plurality of divided display areas may be operable in a first mode and a second mode.

Although it is described in the previous embodiments that only one of the first and second light-emitting elements EL1 and EL2 emits light at the same time, embodiments are not limited thereto. As an example, the first and second light-emitting elements EL1 and EL2 may emit light at the same time, for example, in a third mode other than the first mode and a second mode.

Although the above description is conducted mainly in the context of a vehicle display, the embodiments are not limited thereto. As an example, the pixel circuit of the present application may be applied to any display, such as a television (TV), a set-top box, a navigation system, a personal computer (PC), a home theater device, a mobile system, and a wearable system, etc.

It will be apparent to those skilled in the art that various modifications and variations can be made in the pixel circuit, the display panel and the display device including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A pixel circuit, comprising:
a first light-emitting element;
a second light-emitting element;
a driving element configured to generate a driving current of each of the first and second light-emitting elements;
a first switch element connected between the driving element and a first node and configured to be turned on in response to a gate signal;
a second switch element connected between the first node and the first light-emitting element and configured to be turned on in response to a first control signal; and
a third switch element connected between the first node and the second light-emitting element and configured to be turned on in response to a second control signal,
wherein the first light-emitting element is configured to emit light at a first viewing angle,
wherein the second light-emitting element is configured to emit light at a second viewing angle smaller than the first viewing angle,
wherein the first light-emitting element is covered by a first lens and is configured to emit light at the first viewing angle,
wherein the second light-emitting element is covered by a second lens and is configured to emit light at the second viewing angle, and
wherein a vertical viewing angle of the first light-emitting element is equal to a vertical viewing angle of the second light-emitting element, and a horizontal viewing angle of the first light-emitting element is larger than a horizontal viewing angle of the second light-emitting element.

2. The pixel circuit of claim 1, wherein the first lens is a semi-cylindrical lens having a hemispherical cross section, and the second lens is a semi-spherical lens.

3. The pixel circuit of claim 1, wherein one first lens corresponds to at least two first light-emitting elements in a horizontal direction, and one second lens corresponds to one second light-emitting element.

4. The pixel circuit of claim 1, wherein the first control signal and the second control signal are received from a timing controller.

5. The pixel circuit of claim 1, wherein the second switch element and the third switch element are of a same type, and the first control signal and the second control signal have opposite phases.

6. The pixel circuit of claim 1, further comprising:
a fourth switch element connected directly to the first node and connected to a voltage node for a reference voltage and configured to be turned on in response to a gate signal,
wherein the first node is disposed between the first switch element and the second switch element.

7. The pixel circuit of claim 1, wherein a first non-gate electrode of the first switch element is connected directly to the driving element, and
wherein a second non-gate electrode of the first switch element is connected directly to the first node.

8. A display panel, comprising a plurality of pixel circuits including the pixel circuit of claim 1.

9. A display panel comprising the pixel circuit of claim 1, wherein the display panel includes a first display area and a second display area each having a plurality of pixel circuits disposed therein,
wherein the pixel circuit is disposed in the first display area,
wherein another pixel circuit in the second display area comprises:
another first light-emitting element;
another second light-emitting element;
another driving element configured to generate another driving current of each of the another first light-emitting element and the another second light-emitting element:
another first switch element connected between the another driving element and another first node and configured to be turned on in response to a gate signal;
another second switch element connected between the another first node and the another first light-emitting element and configured to be turned on or off in response to one of the first control signal and the second control signal depending on a mode selection signal; and
another third switch element connected between the another first node and the another second light-emitting element and configured to be turned on or off in response to the other of the first control signal and the second control signal depending on the mode selection signal,
wherein the another first light-emitting element is configured to emit light at the first viewing angle, and
wherein the another second light-emitting element is configured to emit light at the second viewing angle smaller than the first viewing angle.

10. A display device, comprising
a display panel including a first display area and a second display area each having a plurality of pixel circuits disposed therein,
wherein each of the plurality of pixel circuits includes:
a first light-emitting element;
a second light-emitting element;
a driving element configured to generate a driving current of each of the first and second light-emitting elements;
a first switch element connected between the driving element and a first node and configured to be turned on in response to a gate signal;
a second switch element connected between the first node and the first light-emitting element and configured to be turned on in response to a first control signal; and
a third switch element connected between the first node and the second light-emitting element and configured to be turned on in response to a second control signal,
wherein the first light-emitting element is covered by a first lens and is configured to emit light at a first viewing angle,
wherein the second light-emitting element is covered by a second lens and is configured to emit light at a second viewing angle, and
wherein a vertical viewing angle of the first light-emitting element is equal to a vertical viewing angle of the second light-emitting element, and a horizontal viewing angle of the first light-emitting element is larger than a horizontal viewing angle of the second light-emitting element.

11. The display device of claim 10, further comprising a timing controller configured to apply the first control signal and the second control signal.

12. The display device of claim 11, wherein the plurality of pixel circuits disposed in the first display area are configured to receive the first control signal or the second control signal directly from the timing controller.

13. The display device of claim 12, further comprising a MUX switch unit including a plurality of MUX switches connected between the plurality of pixel circuits disposed in the second display area and the timing controller, wherein the MUX switch unit is configured to drive the plurality of MUX switches according to a switch signal applied from the timing controller and apply the first control signal or the second control signal to each of the plurality of pixel circuits disposed in the second display area.

14. The display device of claim 13, wherein the second display area includes a plurality of display areas, and the MUX switch unit is connected to each of the plurality of pixel circuits disposed in the plurality of display areas.

* * * * *